United States Patent [19]
Khater et al.

[11] Patent Number: 6,028,285
[45] Date of Patent: Feb. 22, 2000

[54] HIGH DENSITY PLASMA SOURCE FOR SEMICONDUCTOR PROCESSING

[75] Inventors: Marwan H. Khater, Dallas; Lawrence J. Overzet, Plano, both of Tex.; Blake E. Cherrington, Dayton, Ohio

[73] Assignee: Board of Regents, The University of Texas System, Austin, Tex.

[21] Appl. No.: 08/974,111

[22] Filed: Nov. 19, 1997

[51] Int. Cl.[7] ............................. B23K 10/00; C23C 16/00
[52] U.S. Cl. ................... 219/121.43; 219/121.52; 219/121.4; 118/723 I; 156/345; 315/111.21
[58] Field of Search ........................... 219/121.4, 121.43, 219/121.52; 118/723 I; 156/345, 646.1; 315/111.31, 111.51, 111.21

[56] References Cited

U.S. PATENT DOCUMENTS

| | | |
|---|---|---|
| 4,948,458 | 8/1990 | Ogle . |
| 5,277,751 | 1/1994 | Ogle . |
| 5,280,154 | 1/1994 | Cuomo et al. . |
| 5,304,279 | 4/1994 | Coultas et al. . |
| 5,368,710 | 11/1994 | Chen et al. . |
| 5,401,350 | 3/1995 | Patrick et al. . |
| 5,405,480 | 4/1995 | Benzing et al. . |
| 5,436,528 | 7/1995 | Paranjpe . |
| 5,464,476 | 11/1995 | Gibb et al. . |
| 5,525,159 | 6/1996 | Hama et al. . |
| 5,529,657 | 6/1996 | Ishii . |
| 5,540,800 | 7/1996 | Qian . |
| 5,540,824 | 7/1996 | Yin et al. . |
| 5,558,722 | 9/1996 | Okumura et al. . |
| 5,571,366 | 11/1996 | Ishii et al. . |
| 5,578,165 | 11/1996 | Patrick et al. . |
| 5,589,737 | 12/1996 | Barnes et al. . |
| 5,619,103 | 4/1997 | Tobin et al. ....................... 315/111.51 |
| 5,650,032 | 7/1997 | Keller et al. ............................ 156/345 |
| 5,683,548 | 11/1997 | Hartig et al. ......................... 156/643.1 |
| 5,783,102 | 7/1998 | Keller ..................................... 156/345 |
| 5,846,375 | 12/1998 | Gilchrist et al. ....................... 156/345 |

FOREIGN PATENT DOCUMENTS

| | | |
|---|---|---|
| 0 601 468 A1 | 12/1993 | European Pat. Off. . |
| 0 641 013 A2 | 7/1994 | European Pat. Off. . |
| 0 680 072 A2 | 4/1995 | European Pat. Off. . |
| 0 685 873 A1 | 5/1995 | European Pat. Off. . |
| 0 694 949 A2 | 6/1995 | European Pat. Off. . |
| 0 702 391 A2 | 9/1995 | European Pat. Off. . |
| 0 710 055 A1 | 10/1995 | European Pat. Off. . |

*Primary Examiner*—Mark Paschall
*Attorney, Agent, or Firm*—Daniel F. Perez; Gardere & Wynne, L.L.P.

[57] ABSTRACT

An apparatus for producing a plasma (70) within a vacuum chamber (50) comprising a high density plasma source (10) is disclosed wherein the source (10) comprises a top layer (13) and a bottom layer (11) electrically connected to and spaced apart from each other, in a manner to adjust the fields generated by the source (10), hence the uniformity of the plasma (70), wherein the top and bottom layers (13, 11) are formed by a plurality of conductive loops.

39 Claims, 23 Drawing Sheets

Argon Discharge @ 13.56 MHz
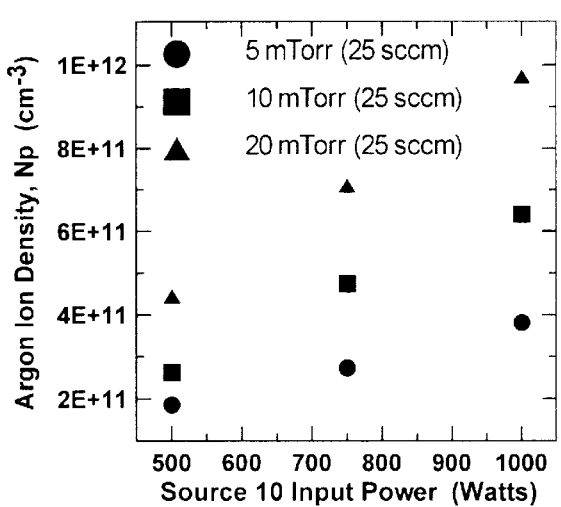
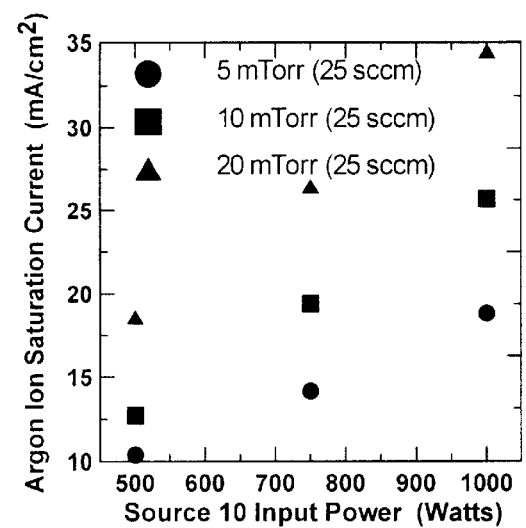
Figure 16a
Figure 16b
$SF_6$ Discharge @ 13.56 MHz
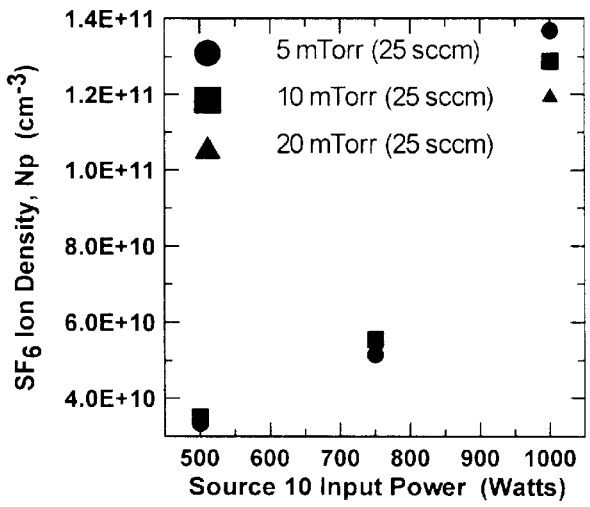
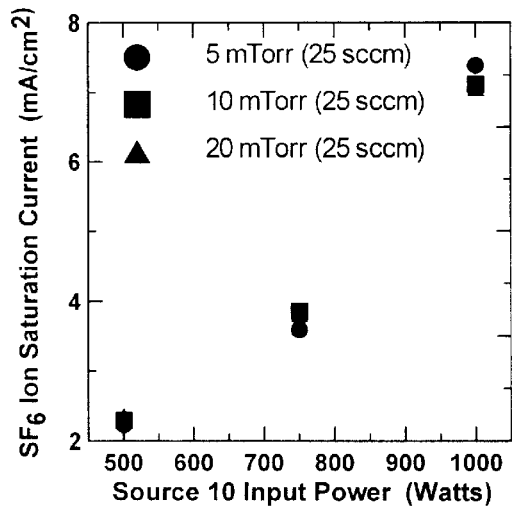
Figure 16c
Figure 16d Figure 17a
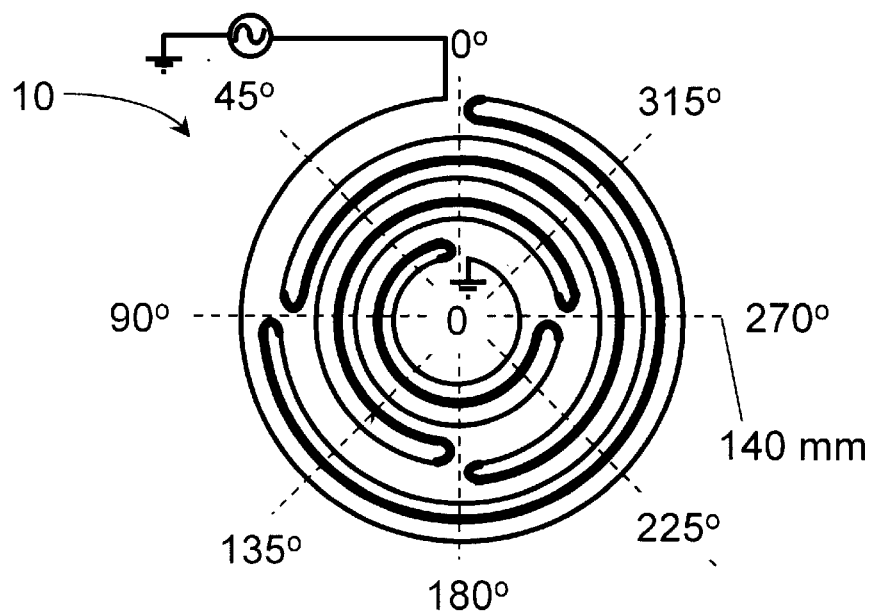
Figure 17b
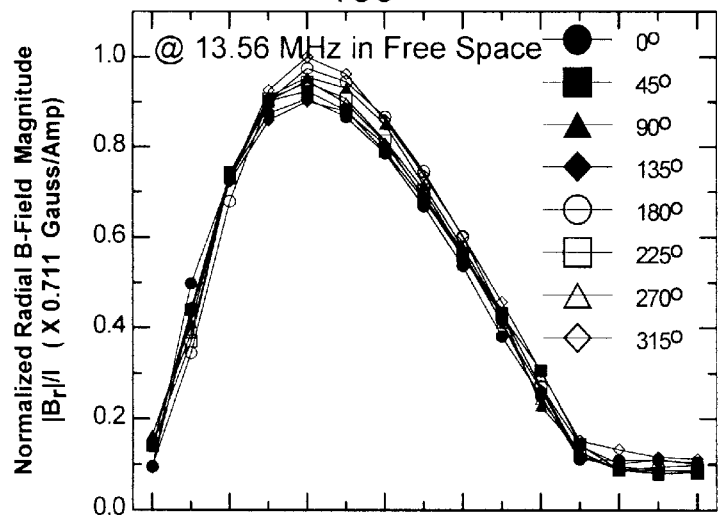
Figure 17c

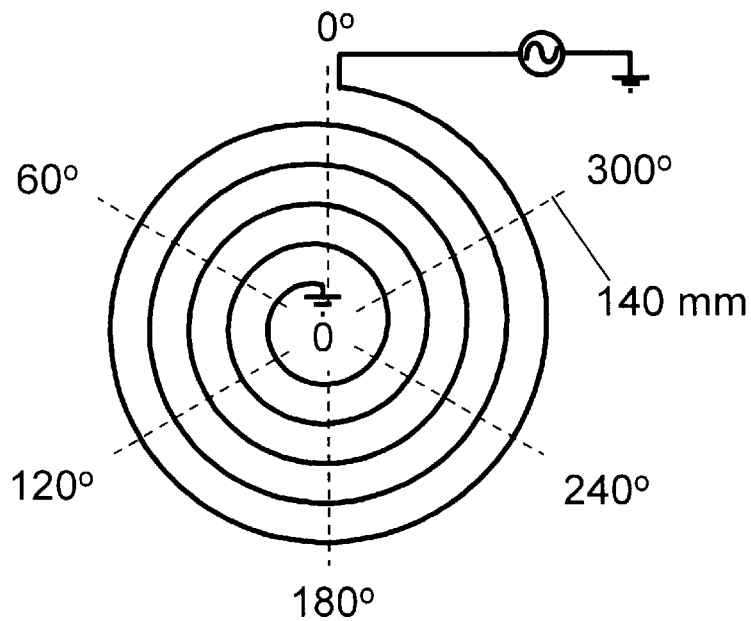
Figure 18a (Prior art)
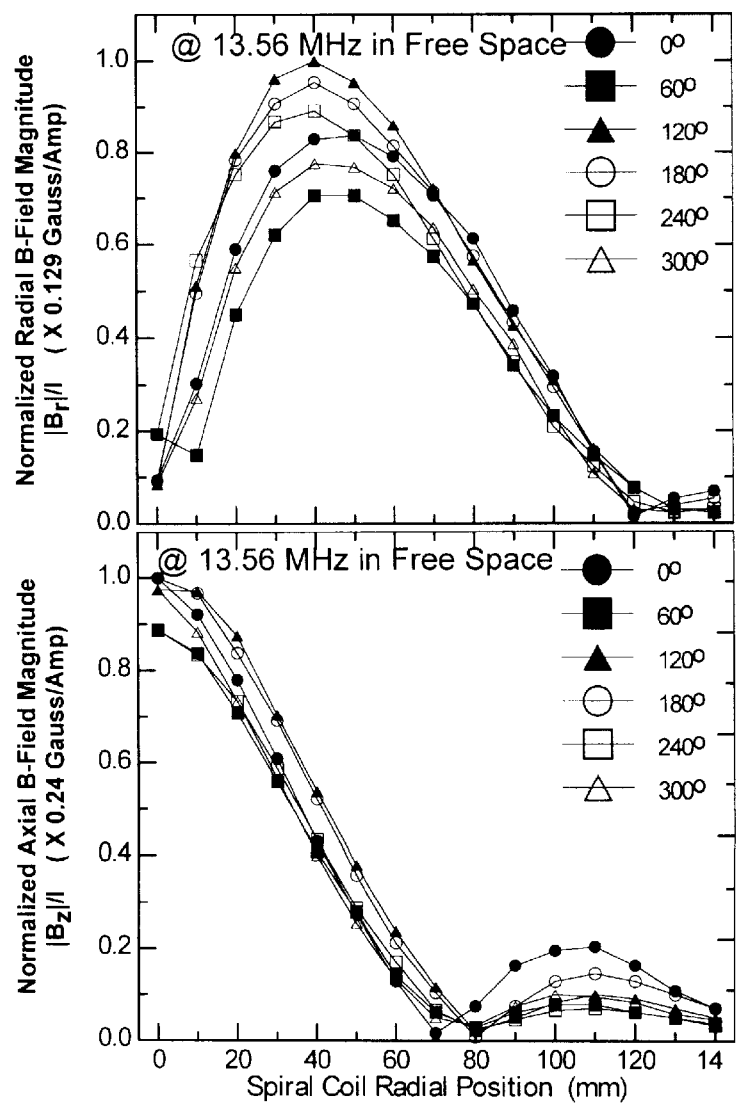
Figure 18b (Prior art)
Figure 18c (Prior art)

HIGH DENSITY PLASMA SOURCE FOR SEMICONDUCTOR PROCESSING

TECHNICAL FIELD OF THE INVENTION

The present invention relates, in general, to the field of plasma processing, and in particular, to an apparatus for generating high density plasma at low pressure within a plasma chamber that uses a source having a multi-layer configuration.

BACKGROUND OF THE INVENTION

Without limiting the scope of the invention, the background is described in connection with plasma processing in the semiconductor industry, such as plasma etching or plasma deposition, as an example.

A plasma is an ionized gas which is used during the processing and manufacturing of semiconductor devices. For example, plasma is used to etch or remove material from the surface of semiconductor wafers. Plasma may also be used to deposit material onto the surface of semiconductor wafers. In another application, semiconductor wafers or substrates can be implanted with ions in a plasma in a process known as Plasma Immersion Ion Implantation (PIII). Thus, the use of plasma in the fabrication of semiconductor devices is wide spread in the microelectronics manufacturing industry.

Producing a plasma typically involves the use of a low pressure or vacuum chamber into which a processing gas is introduced. Once a plasma is generated within the processing vacuum chamber, the plasma surrounds the semiconductor wafer so that, for example, layers may be removed from the wafer surface or disposed thereon due to chemical reactions on the wafer surface caused by the plasma. The chamber, which is used to maintain the low pressure required for plasma processing, also serves as a structure for attachment of the plasma source. The plasma source or antenna, ionizes the processing gas within the chamber, thereby generating the plasma.

It has been found that while high density plasmas are desirable, conventional systems generate low density plasmas. This lead to the development of high density plasma sources such as inductively coupled plasma (ICP), ECR, and helicon sources. Inductively coupled plasma sources are generally in the form of a coil which couples the rf power to the processing gas through its rf magnetic fields. The magnetic fields penetrate a dielectric window into the processing chamber and induce an electric field that initiates and sustains the plasma by accelerating its free electrons. ICPs are attractive for the semiconductor industry because they can produce high densities at low pressures. Low pressure operation is required to control the anisotropy of the plasma etching to produce sub-half micron features, which allows higher device packing density and better device performance.

One type of inductively coupled plasma sources is a flat spiral coil such as that shown in U.S. Pat. No. 4,948,458. It generates a planar magnetic field that induces a circulating electric field, which greatly increases the electrons travel path in the plasma before they diffuse to the chamber walls. Moreover, as the electrons are closely confined to a plane that is parallel to the coil, transfer of kinetic energy to the ions in a direction perpendicular to the wafer surface is minimized, hence plasma damage to the wafer surface is reduced. As a result, the ion velocity component towards the wafer surface can be controlled by independently biasing the wafer electrode. This feature of ICPs allows independent control over the ion energy directed towards the wafer surface, while the plasma density can be increased independently by increasing the input power to the source. Conventional plasma processing systems, such as capacitively coupled plasma systems, do not have the ability to decouple the ion energy from the power deposition into the plasma.

Other coil configurations have been employed to generate inductively coupled plasmas. Solenoidal coils can be wrapped around a dielectric chamber to generate ICPs as described in U.S. Pat. No. 3,705,091. Two other configurations of ICP sources are described in U.S. Pat. No. 5,277,751 and No. 5,280,154 respectively. These patents describe a solenoidal coil with at least one flat side to provide a planar surface disposed against the dielectric window.

The uniformity of the plasma density affects the uniformity of the processing across the wafer surface and is another important aspect of plasma source design. A major problem caused by non-uniform plasmas is the uneven etching of transistor gate layers or the etching of the dielectric material around these layers. The deposition of various materials and removal of unwanted features by etching using to plasma is common throughout the industry. Due to uneven plasma etching over the wafer surface, it is general practice to employ an "over-etch" period in order to make sure that all unwanted features are cleared away.

It has been found that the use of a planar spiral coil may result in azimuthal process asymmetries and non-uniformities. For example, the uniformity of the plasma density and ion flux profiles to the wafer surface are greatly influenced by the transmission line properties and geometry of the spiral coil. Also, it has been observed that the placement of the spiral coil affects the etch rate profile. For example, a significant improvement in the etch rate profile uniformity has been found as the coil center was shifted from the wafer center, as well as a rotation in the etch rate profile non-uniformities when the coil was rotated by 180° around its axis. Also, it has been found that a dielectric window with a thicker portion at the center improved the etch rate uniformity compared to a flat dielectric window as described in U.S. Pat. No. 5,226,967 and No. 5,368,710. The plasma density uniformity of a flat spiral coil can also be improved by placing magnetic dipoles around the processing chamber, which provides a surface magnetic field for confining the plasma as described in U.S. Pat. No. 5,304,279.

Unlike conventional plasma sources, ICP source geometry can easily be altered to improve the plasma uniformity across the wafer surface. An alternative configuration of an inductive coil, is a coil having a planar and a tubular portion as described in U.S. Pat. No. 5,309,063. It provided a more uniform plasma density across the chamber, compared to a planar spiral coil. The plasma ion flux uniformity to the wafer surface can be improved by contouring the spiral coil and the dielectric window as described in the U.S. Pat. No. 5,231,334. U.S. Pat. No. 5,346,578 describes an expanding spiral coil that has a hemispherical shape following the contour of a hemispherical shaped quartz bell jar, which serves as the processing chamber. This design achieved a good plasma ion current uniformity across a 200 mm wafer. A non-uniformly spaced spiral coil, described in U.S. Pat. No. 5,401,350, improved the plasma uniformity compared to an equally spaced spiral coil.

As the semiconductor industry shifts toward large area wafer processing, high density plasma sources that generate uniform plasmas over a large area are needed. ICP sources are good candidates to meet these challenges due to their construction simplicity and potential for scaling. For example, U.S. Pat. No. 5,261,962 describes a large area planar ICP antenna, formed by disposing straight conductor elements in the shape of a ladder. The antenna was used as a plasma source for a plasma enhanced chemical vapor deposition (PECVD) system. The deposited thin film was very uniform across large area substrates. U.S. Pat. No. 5,464,476 describes a large area substrate plasma source assembly. The source comprises a plurality of spiral coils placed adjacent to each other in a form of an array. Plasma processing of large workpieces was also described in U.S. Pat. No. 5,589,737. The plasma source is an ICP planar coil that has plural segments of equal length connected in parallel to an rf power source.

What is needed, therefore, is a source that generates a uniform high density plasma within a vacuum chamber that permits high processing rates and uniform deposition and etching of materials on semiconductor wafers. Also, what is needed is a source that can be scaled to process large area wafers, while maintaining high processing rates and uniformity.

SUMMARY OF THE INVENTION

In the present invention, an electrically conductive source, that has a three dimensional structure, is used in order to produce very uniform high density plasmas at low pressure within a vacuum chamber. The present invention is an inductively coupled plasma source for generating a plasma comprising, a first layer and a second layer electrically connected to and spaced apart from the first layer, in a manner to adjust and optimize the magnetic fields generated by the source to improve the plasma uniformity. Each of the layers of the source of the present invention are formed from a plurality of loops which are connected to the loops of the other layer by a plurality of turns.

In one embodiment of the present invention, the loops of the first and second layers may be generally concentric about a single center of rotation. Alternatively, the loops of either the first layer or the second layer or both may be generally concentric about a plurality of centers of rotation.

The loops of either the first layer or the second layer or both may form circumferential arcs between about 20 degrees and 360 degrees. In one embodiment, loops of either the first layer or the second layer or both may form circumferential arcs between about 90 degrees and 270 degrees or between about 135 degrees and 225 degrees.

The ends of each of the loops of either layer define circumferential gap therebetween. In one embodiment, the circumferential gaps in the loops of either the first layer or the second layer or both may be the same length. Alternatively, the circumferential gaps in the loops of either the first layer or the second layer or both may have the same or different arc lengths.

In one embodiment, the loops of the first layer are disposed between the radial gaps formed by the loops of the second layer. Alternatively, the loops of the first layer may have the same radii as the loops of the second layer.

The loops of either the first layer or the second layer or both may have different cross-sectional areas. In one embodiment, the loops of either the first layer or the second layer or both may have larger cross-sectional areas near the source perimeter. Alternatively, the loops of either the first layer or the second layer or both may have larger or smaller cross-sectional areas near the center of the source or at the mid-radius of the source.

In one embodiment of the present invention, the current through the loops of the first layer flows in one direction while the current through the loops of the second layer flows in the opposite direction. In another embodiment, the current through some of the loops of the first layer flows in one direction while the current through other loops of the first layer flows in the opposite direction.

In one embodiment of the present invention, the loops of the one layer each have the same radius such that the loops of that layer substantially form a single circle. Alternatively, half of the loops of one layer may have a first radius and the other half of the loops of that layer may have a second radius such that the loops of that layer substantially form first and second circles.

The loops of either the first layer or the second layer i or both may have a substantially planar profile or may have a non-planar profile. Additionally, the source of the present invention may include a support structure or a plurality of spacer members disposed generally between the first and second layers to provide mechanical support thereto.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which:

FIG. 16a is a plot depicting ion density in argon discharges as a function of pressure and source input power;

FIG. 16b is a plot depicting ion saturation current in argon discharges as a function of pressure and source input power;

FIG. 16c is a plot depicting ion density in $SF_6$ discharges as a function of pressure and source input power;

FIG. 16d is a plot depicting ion saturation current in $SF_6$ discharges as a function of pressure and source input power;

FIG. 17a is a top view of a plasma source of the present invention illustrating the azimuthal positions for the magnetic field radial scans;

FIG. 17b is a plot of the spatial profiles of the radial magnetic fields per amperes generated by the source of the present invention depicted in FIG. 17a;

FIG. 17c is a plot of the spatial profiles of the axial magnetic fields per amperes generated by the source of the present invention depicted in FIG. 17a;

FIG. 18a depicts a prior art spiral coil;

FIG. 18b is a plot of the spatial profiles of the radial magnetic fields per amperes of the prior art spiral coil of FIG. 18a;

FIG. 18c is a plot of the spatial profiles of the axial magnetic fields per amperes of the prior art spiral coil of FIG. 18a.

DETAILED DESCRIPTION OF THE INVENTION

While the making and using of various embodiments of the present invention are discussed in detail below, it should be appreciated that the present invention provides many applicable inventive concepts which can be embodied in a wide variety of specific contexts. The specific embodiments discussed herein are merely illustrative of specific ways to make and use the invention and do not delimit the scope of the invention.

The apparatus of the present invention allows greater control over the uniformity of plasma in a chamber by using a source having three dimensional structure. The design of the source of the present invention produces magnetic fields of high azimuthal symmetry that induces a highly symmetric azimuthal electric field which sustains inductively coupled plasma.

Figure 1A:
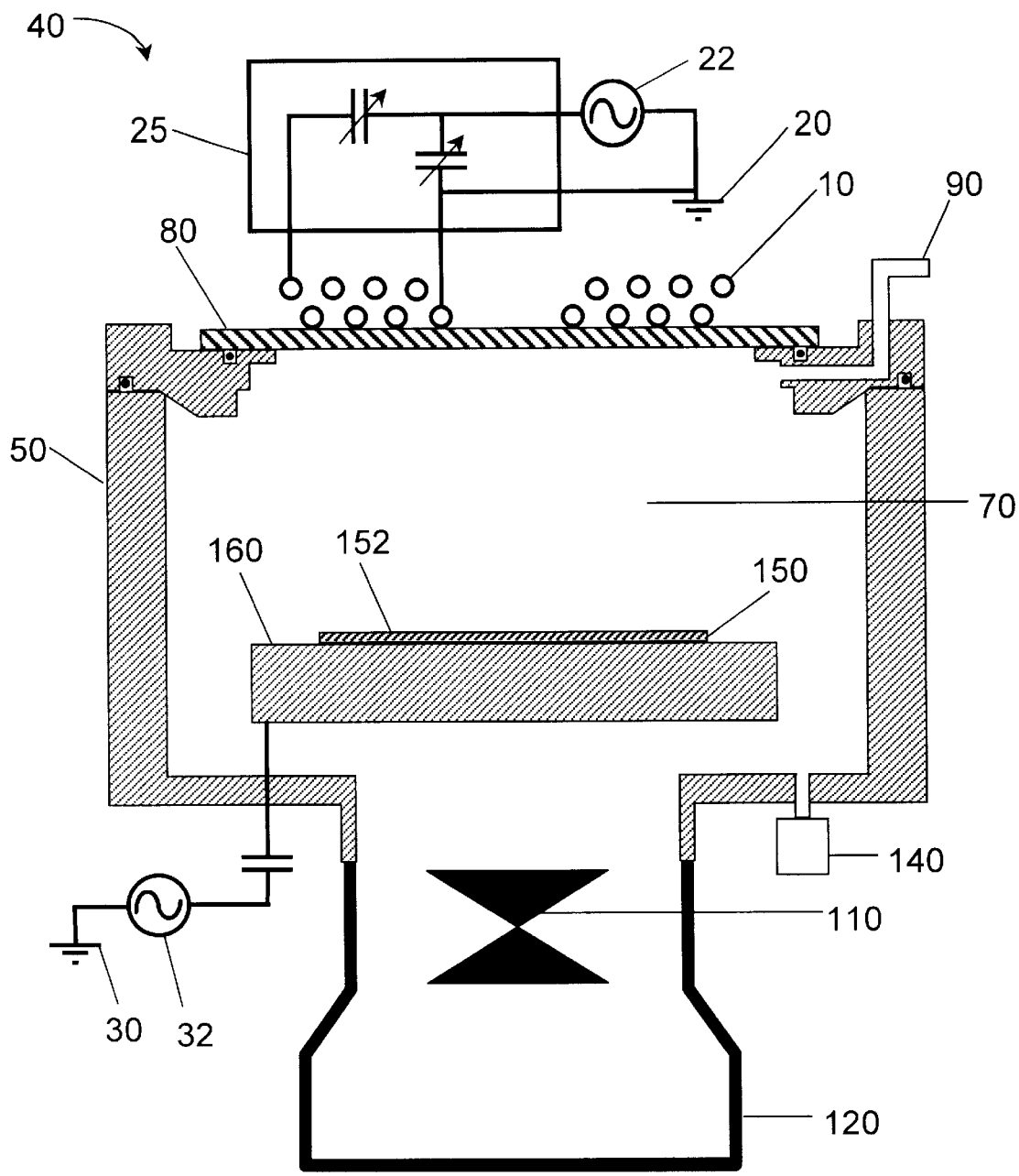
FIG. 1a is a cross sectional view of a plasma processing reactor for use with the source of the present invention.

The features of a silicon wafer processing plasma reactor for use with the source of the present invention is shown in FIG. 1a and is generally designated 40. The plasma reactor 40 has a conductive or non-conductive plasma chamber 50. Examples of conductive materials that may be used to make the plasma chamber 50 are steel and aluminum. Examples of non-conductive materials that may be used to make the plasma chamber 50 are dielectrics such as ceramics, alumina, glass or quartz. The plasma chamber 50 can also be made from conductive material where the inside of chamber 50 is coated with a dielectric, such as alumina, or covered by dielectric sleeves such as ceramics. Adjacent to the plasma chamber 50 is a radio-frequency (rf) high density plasma source 10, depicted here in cross-section. The plasma source 10 is powered by an rf power source 22, through a matching network box 25. The plasma source 10 is placed adjacent to a dielectric window 80, which may be constructed from materials such as quartz or alumina, to allow rf fields generated by source 10 to penetrate into the chamber 50 to produce plasma 70.

A gas inlet 90 serves to feed gas into the plasma chamber 50. Examples of gases that may be used in the plasma chamber 50 include Argon, Oxygen, $CF_4$, HBr, and Chlorine. The particular gas used will depend on the material of the surface to be processed, e.g., polysilicon, aluminum or silicon dioxide, and is well known to those skilled in the art. A vacuum is generated in the plasma chamber 50 by a vacuum pump 120. A vacuum can be drawn by a variety of vacuum systems depending on the level of internal pressure desired. The internal pressure of the plasma chamber 50 is measured using a pressure gauge 140, which may be a capacitance manometer. The operating pressure may be controlled using a feedback controlled throttle valve 110.

An object such as a silicon wafer 150 is placed having a surface 152 facing the interior of the plasma chamber 50 on an electrode 160. The wafer electrode 160 can be biased independently by an rf power source 32. The surface 152 of the wafer 150 to be processed is in contact with the plasma 70 within the plasma chamber 50.

Figure 1B:
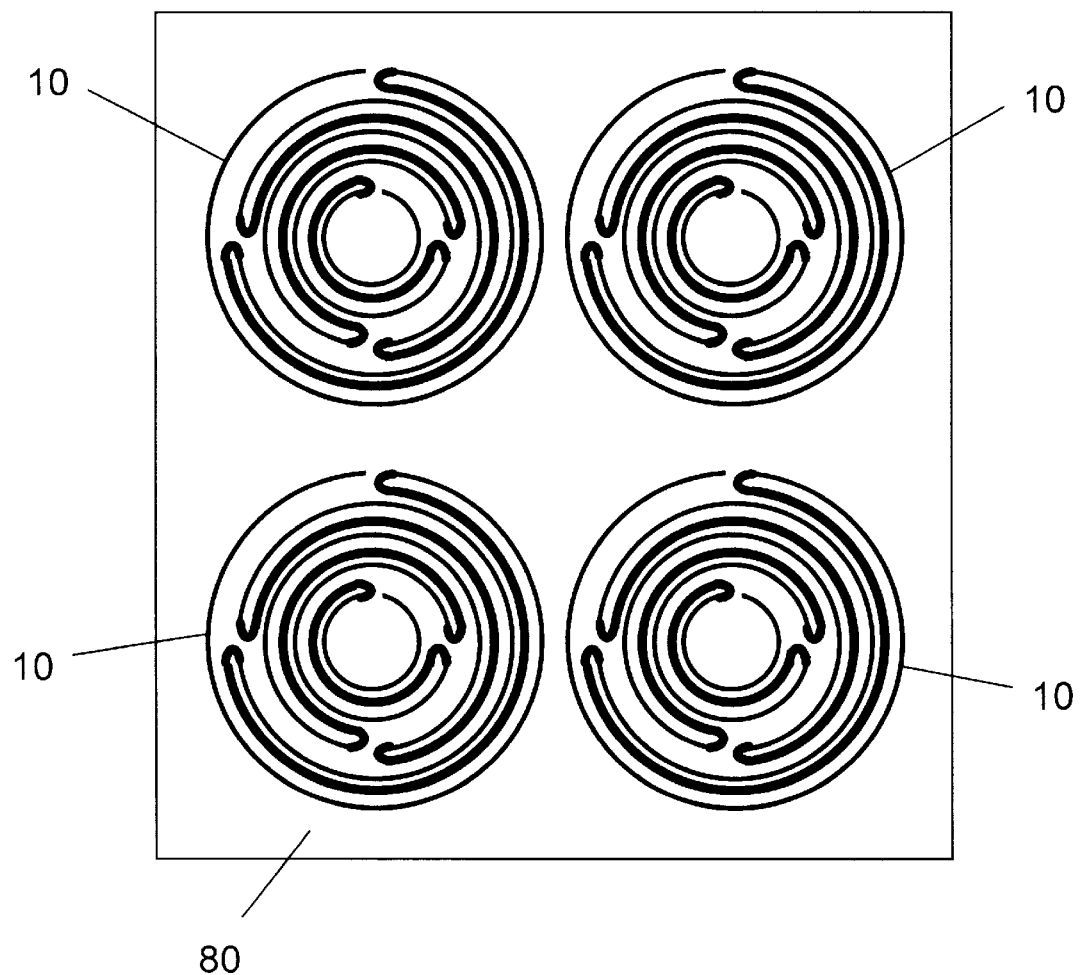
FIG. 1b is a top view of an array of plasma sources of the present invention.

Even though FIG. 1a depicts a single source 10 operating in plasma chamber 50, it should understood by one skilled in the art that multiple sources 10 may be used in conjunction with one another in a variety of orientations. For example, sources 10 may be stacked one on top of another sharing a common axis of rotation or sources 10 may be oriented at a variety of elevations above dielectric window 80 without sharing a common axis of rotation. Alternatively, as depicted in FIG. 1b, sources 10 may be placed in an array above dielectric window 80. As is apparent to those skilled in the art, each of these multiple source 10 orientations may be utilized to produce a large area plasma of high uniformity.

Figure 2:
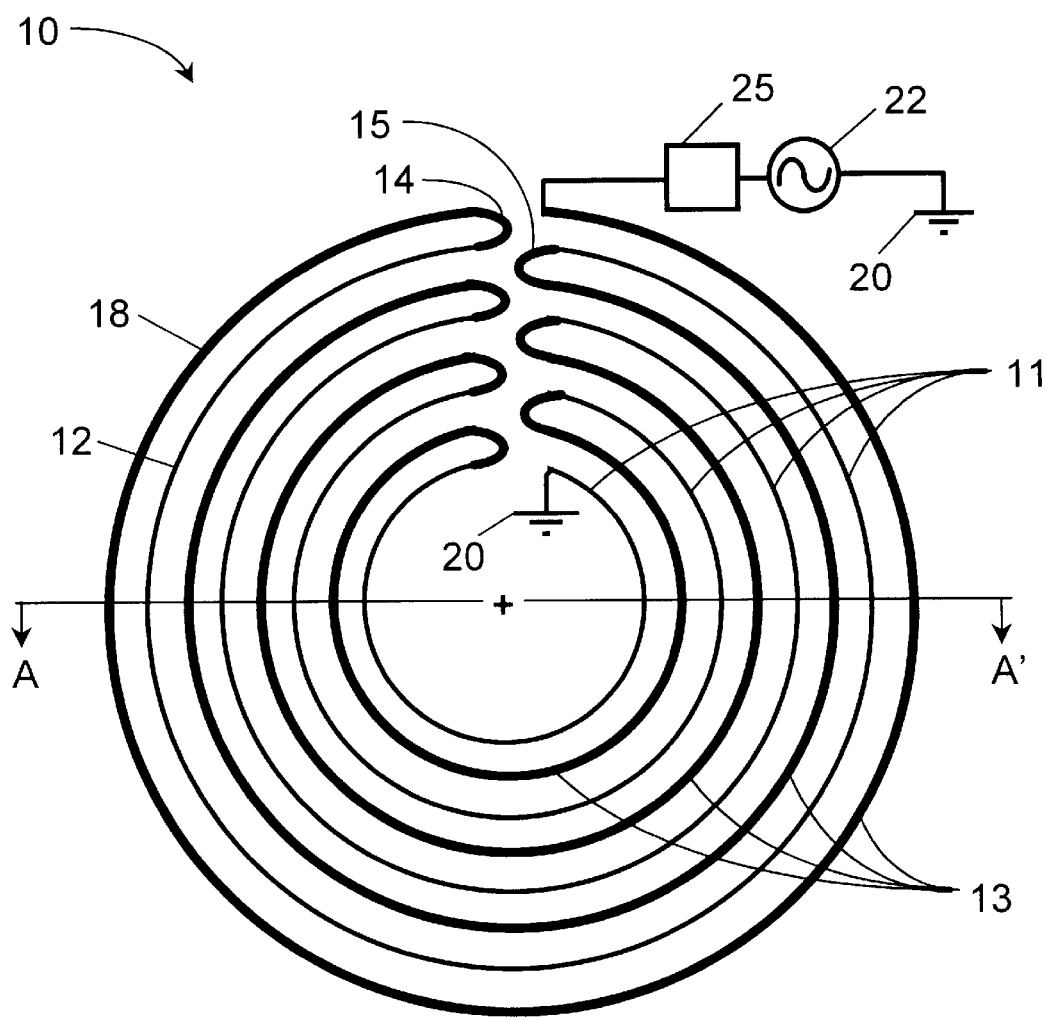
FIG. 2 is a top view of a plasma source of the present invention.

The general features of a source 10 of the present invention are shown in FIG. 2. The source 10 produces rf magnetic fields of high symmetry thereby providing high plasma uniformity. High density plasmas can be achieved with the source 10 in the range of $10^{11}$–$10^{12}$ cm$^{-3}$ at low pressures (e.g. 1–20 mTorr).

The source 10 may be comprised of a single coil or multiple coils that are interconnected and may form substantially parallel layers about a common plane. Multiple sources 10 may be placed adjacent to each other, to form an array of sources 10, or may be stacked on top of each other to form a single high density plasma source to produce large area plasma of high uniformity. The multiple sources 10 can be powered individually by separate rf power sources 22, or can be powered by a single rf power source 22 if connected in series and/or parallel to each other.

It should be apparent to those skilled in the art that the size of source 10 will be selected based upon, for example, the number of silicon wafers 150 to be processed or the size of the silicon wafer 150 to be processed.

High density plasma source 10 includes a top layer 13 of loops and a bottom layer 11 of loops. In all the embodiments of the plasma source 10 of the present invention the loops of top layer 13 are drawn as wider lines than those representing the loops of bottom layer 11 in an attempt to illustrate the three dimensional structure of source 10.

FIG. 2 is a top view of one embodiment of source 10 where the bottom layer 11 is created by a series of loops, such as loop 12. Loop 12 travels nearly 360 degrees around the circumference of the source 10, from turn 14 until it reaches turn 15. Turns 14 and 15 are generally perpendicular in direction to bottom layer 11 and top layer 13. At turn 14, loop 12 becomes loop 18 of top layer 13. The loop 18 travels around source 10 nearly 360 degrees from turn 14, in an opposite direction to loop 12, to an rf power source 22, through a matching network 25. As such, it should be appreciated by those skilled in the art that the term loop as used herein describes the portion of source 10 on a single layer extending between turns and does not indicate the arc length of that portion of source 10.

Moving toward the center of source 10, top layer 13 is comprised of a plurality of concentric loops, such as loop 18, each having a smaller radius. Similarly, bottom layer 11 is comprised of a plurality of concentric loops, such as loop 12, which have progressively smaller radius toward the center of source 10. The corresponding progressively smaller loops of top layer 13 and bottom layer 11 are connected together by turns, such as turn 14, which connects loop 18 to loop 12. In the center of source 10, bottom layer 11 is shown connected to ground 20. Source 10 can also have a discrete termination impedance, e.g. capacitance, where a capacitor can be connected in series with source 10 at the ground 20. The termination impedance value determines the positions of the rf voltage minima and rf current maxima along the length of source 10, which, in turn, partially determines the symmetry of the fields generated by source 10 and, hence, impacts the plasma uniformity.

It should be noted, that even though the loops of bottom layer 11 and top layer 13 decrease in radius in a descending order, as depicted in FIG. 2, moving from the edge of source 10 towards the center of source 10, this may not always be the case. The radii of either top layer loops 13 or bottom layer loops 11 may vary in any order necessary to adjust the magnetic filed profiles generated by source 10 as will be further explained hereinafter.

Source 10 may be powered by connecting the rf power source 22 to the bottom layer 11 at the center of source 10, while the ground 20 can be connected to loop 18 of top layer 13. An alternative way of connecting the rf power source 22 to source 10 is such that, both the center and the outer edge, e.g. top loop 18, of source 10 may be connected to ground 22, whereas the rf power source 20 can be connected through the matching network 25 to any of the turns connecting bottom layer 11 to top layer 13, such as turns 14 or 15, or to any point along any loop in bottom layer 11 or top layer 13. Source 10 may be operated at various rf frequencies such as, but not limited to, 13.56 MHZ, 27.12 MHZ, and 40.68 MHZ.

Figure 3A:
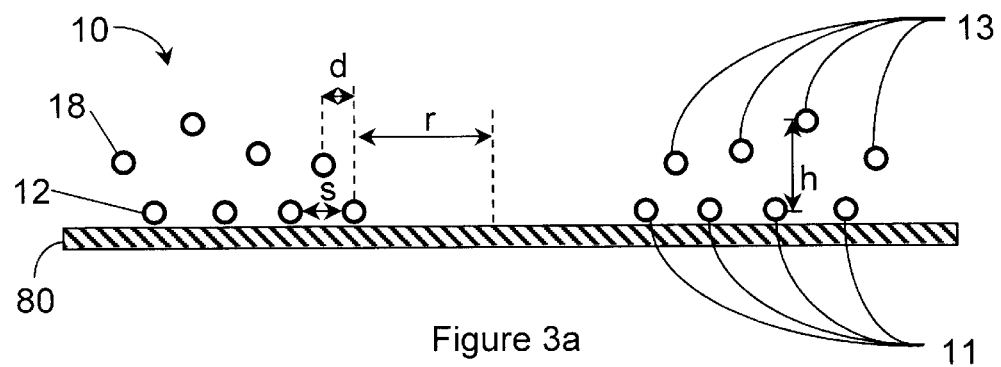
FIG. 3a is a cross-sectional view of the plasma source depicted in FIG. 2 taken along line A–A'.

FIG. 3a depicts source 10 in a cross-sectional view taken along line A–A' of FIG. 2. Bottom layer 11, which includes loop 12, has a generally planar profile, but may have a non-planar profile. Top layer 13, which includes loop 18, has a non-planar or arch-like profile, but may have a planar profile. As should be apparent to those skilled in the art, the term layer as used herein does not indicate a planar surface, rather the term layer simply implies a spaced apart relationship between the loops of bottom layer 11 and the loops of top layer 13. A distance h is depicted in FIG. 3a, which describes the spacings between individual loops of top layer 13 and bottom layer 11.

The distance s, depicted in FIG. 3a, measures the spacings between the loops of bottom layer 11 or top layer 13, i.e., radii increments. The distance d, depicted in FIG. 3a, measures the spacings between the loops of bottom layer 11 and top layer 13. The distances d can be chosen such that the loops of bottom layer 11 may be configured in any order with respect to the loops of top layer 13. Distances s, d and h may vary, in steps or gradually, along individual loops of bottom layer 11 and top layer 13. It should be noted by one skilled in the art that the exact profile of bottom layer 11 and top layer 13 may be altered by, among other things, altering the distances s, d and h between various loops of bottom layer 11 and top layer 13. By modifying the profiles of bottom layer 11 and top layer 13, including changing distances d and distances h, control is exerted over the plasma uniformity profile due to the changes in the magnetic field profiles generated by source 10.

Either bottom layer 11 or top layer 13 may have arbitrary number of loops that travel in the same and/or opposite direction, that may have the same or different center of rotation and have arbitrary radii, in a manner necessary to alter the magnetic fields generated by source 10, hence the plasma uniformity. Since the rf current flows in the top layer 13 in a direction opposite to that in the bottom layer 11, the rf electromagnetic field profiles generated by source 10, that sustain plasma 70, can be adjusted by adjusting the spacing between the loops, hence the plasma uniformity over a large area.

The magnetic field profiles generated by source 10 can be further altered by having the individual loops, of bottom layer 11 and/or top layer 13, travel an arbitrary fraction of 360 degrees around the circumference of source 10. In addition, the loops of the top layer 13 and/or bottom layer 11 may have any arbitrary shape of symmetry, for example, circular, polygonal and hexagonal. Thus, by modifying the design parameters within the multi-layer source 10 of the present invention, control may be exerted over a wide variety of plasmas used in numerous applications.

The loops of source 10 of the present invention may be constructed from a continuous solid or hollow conductor, such as a rod, tubing or a flat strip. Source 10 may also be formed by interconnecting conducting rings, each representing a single loop of top layer 13 and bottom layer 11, with electrically conductive turns such as turns 14 and 15. The cross-section of the loops may have any arbitrary shape, including circular, square, rectangular, or otherwise shaped. In addition, the cross-section area of the loops may be varied along an individual loop and/or among the different loops of top layer 13 and/or bottom layer 11, in a fashion to adjust the electrical impedance distribution of source 10, hence the magnetic field profiles generated by source 10.

Source 10 should be made from electrically conductive materials that have low series resistance. Examples of materials that can be used to make source 10 of the present invention include copper or aluminum. The loops of source 10 may also be coated with a layer of different conductive material, e.g. silver, having a different, generally smaller, electrical resistance than the base material of the loops of source 10. Other coatings may also be used such as aluminum, and other low series resistance metals.

Source 10 can be formed by mechanical means such that it has an air core in the gap separating bottom layer 11 and top layer 13, as depicted in FIG. 2. Having an air core helps in cooling the dielectric window 80 and the source 10 from the heat generated by plasma 70.

Figure 3B:
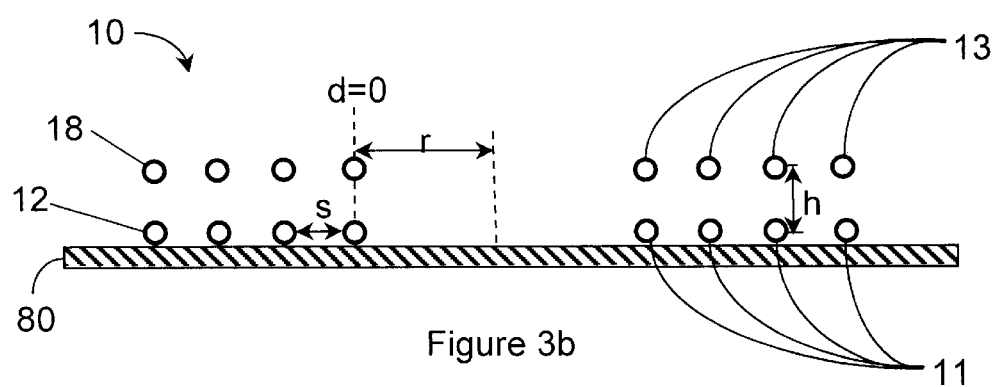
FIG. 3b is a cross-sectional view of another embodiment of the plasma source depicted in FIG. 2 taken along line A–A'.

FIG. 3b depicts an alternate embodiment of source 10 in a cross-sectional view taken along line A–A' of FIG. 2. Bottom layer 11, which includes loop 12 and top layer 13, which includes loop 18, both have a generally planar profile. As described above, distance d measures the spacing between the loops of top layer 11 and bottom layer 13. In FIG. 3b, however, distance d is zero, thus placing the loops of top layer 13 directly above bottom layer 12 in this embodiment.

Figure 3C:
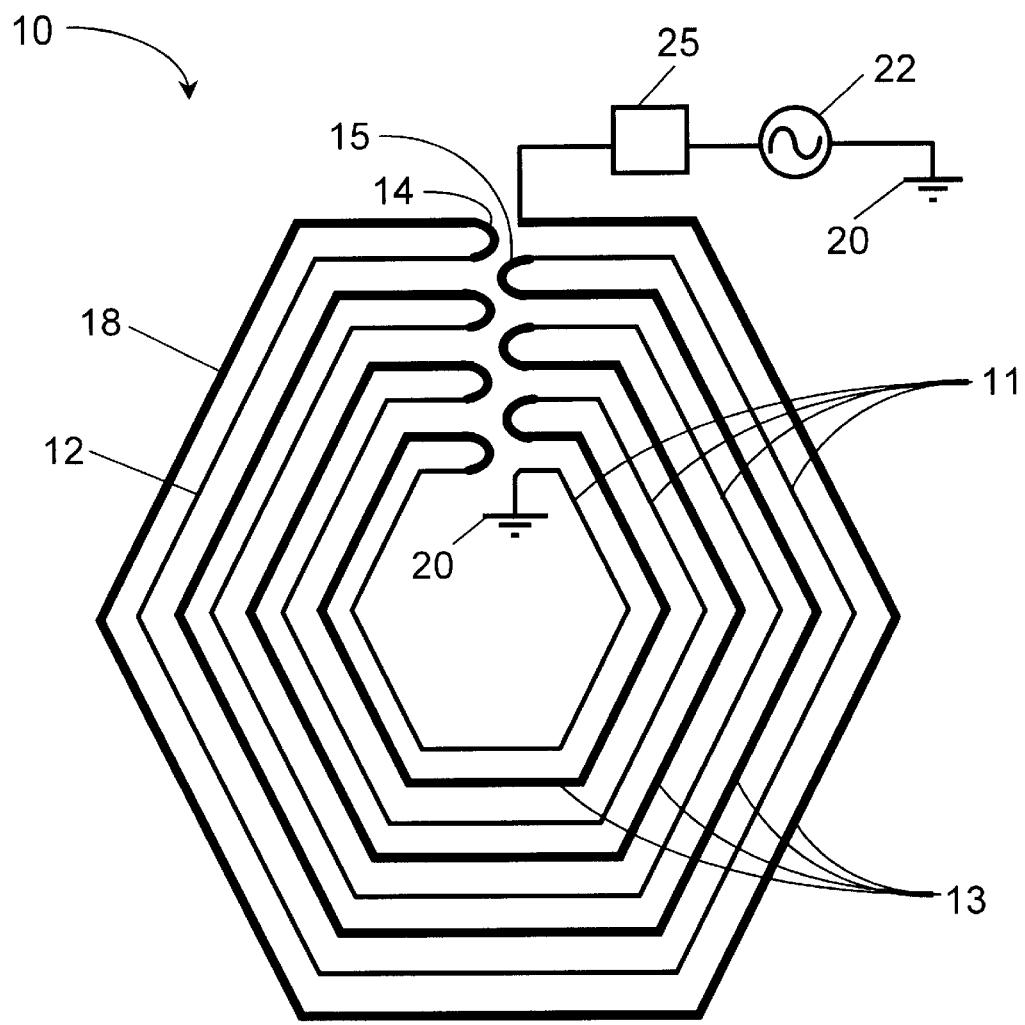
FIG. 3c is a top view of a plasma source of the present invention with a hexagonal symmetry.

Even though FIGS. 2, 3a and 3b have depicted source 10 as circular, it should be apparent to those skilled in the art that a variety of other geometric configurations may be used without departing from the principles of the present invention. For example, FIG. 3c depicts a hexagonal source 10 having a bottom layer 11 including loop 12 and a top layer 13 including loop 18. In fact, the geometric shape of source 10 may be selected based upon the shape of the object to be processed within chamber 50.

Figure 4A:
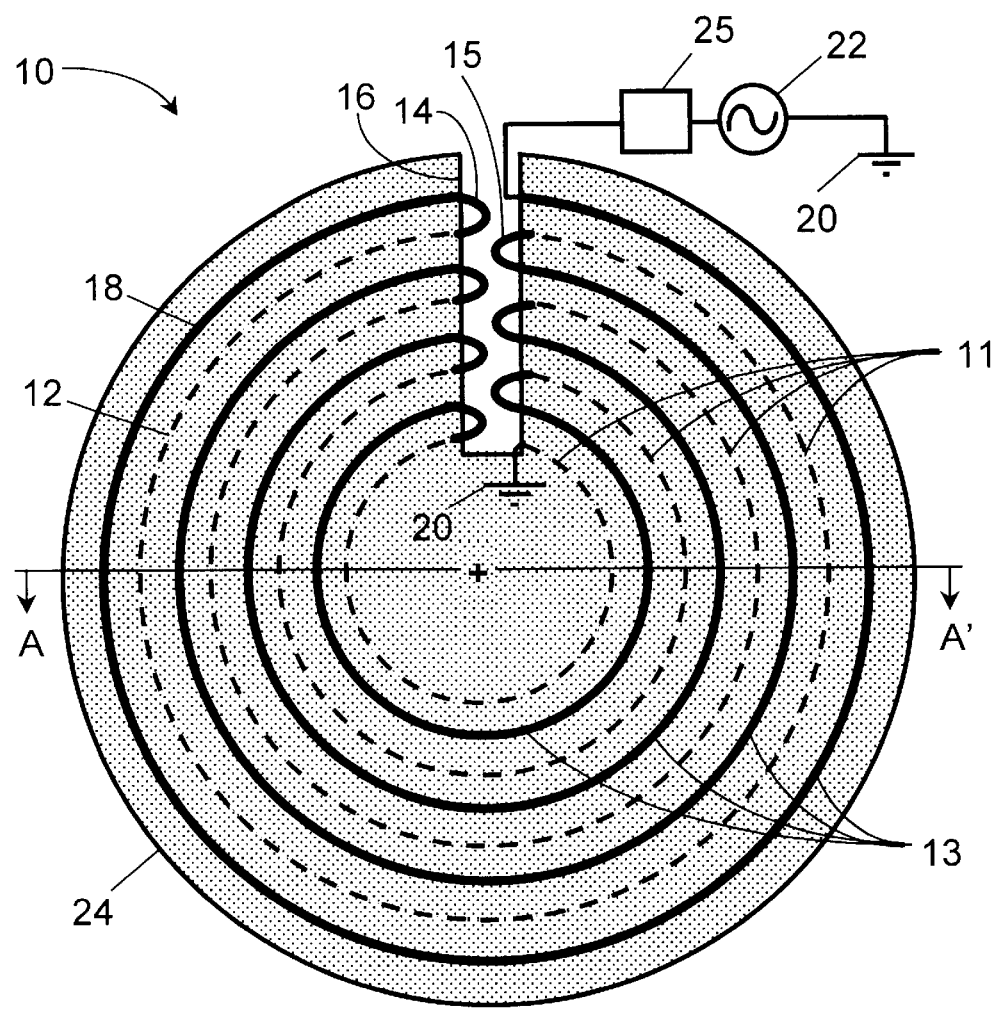
FIG. 4a is a top view of a plasma source of the present invention with supporting structure.
Figure 4B:
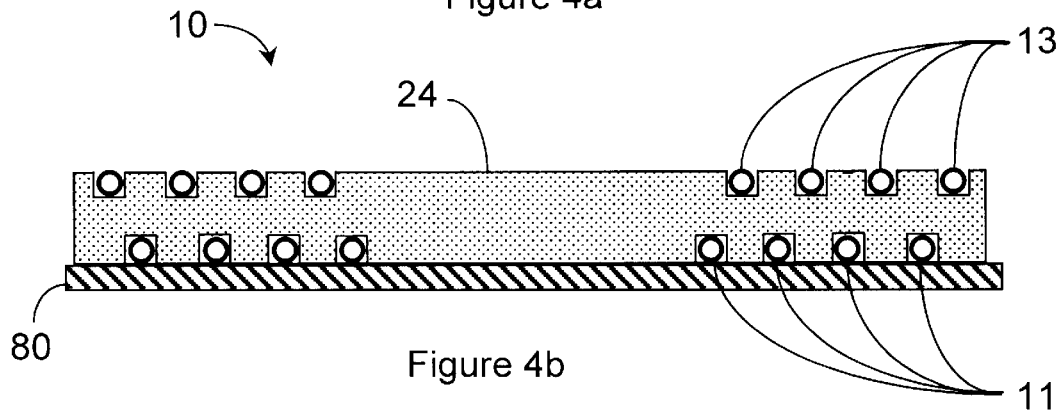
FIG. 4b is a cross-sectional view of the plasma source depicted in FIG. 4a taken along line A–A'.
Figure 5A:
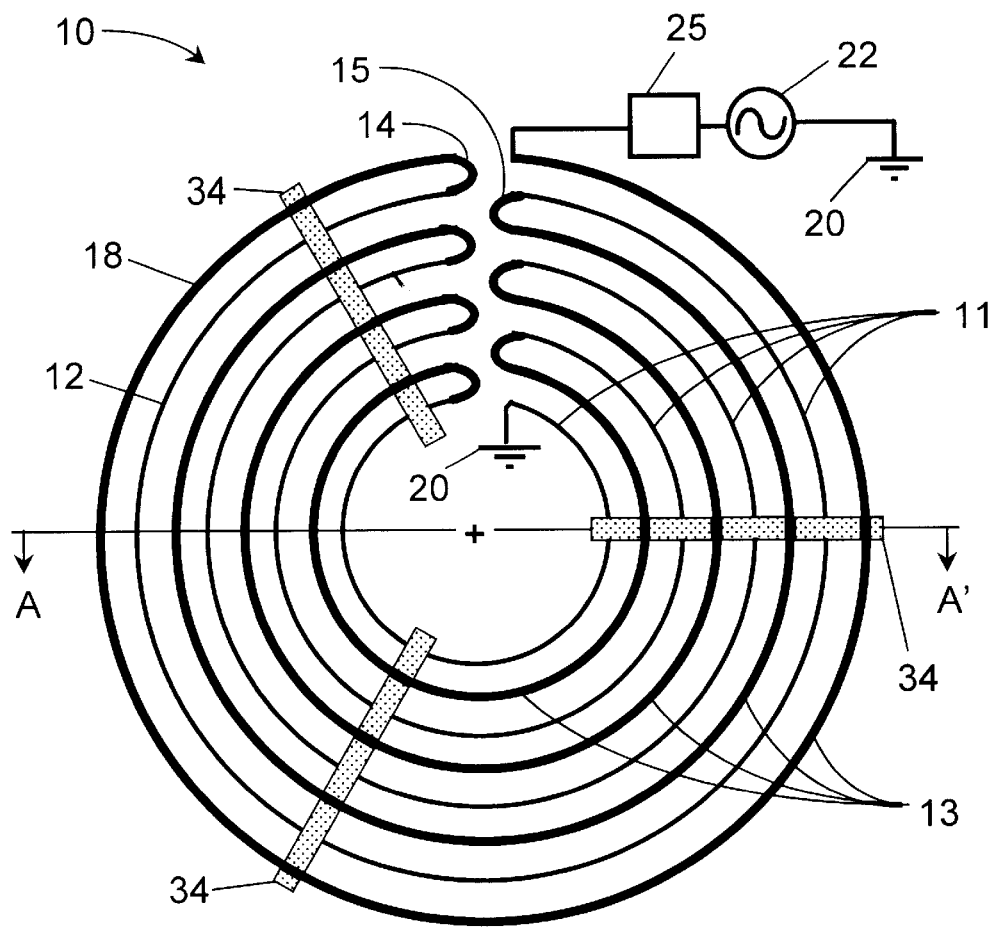
FIG. 5a is a top view of a plasma source of the present invention with supporting spacers.
Figure 5B:
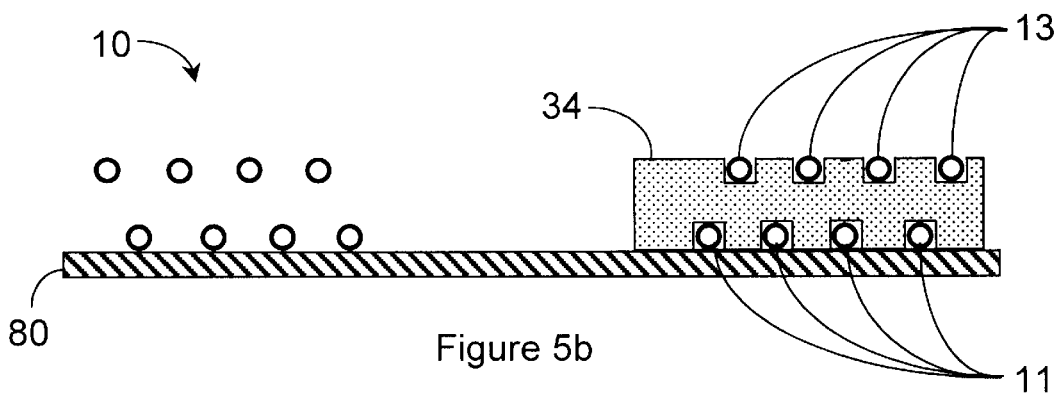
FIG. 5b is a cross-sectional view of the plasma source depicted in FIG. 5a taken along line A–A'.

In FIG. 4a, a supporting structure 24 is depicted disposed between top layer 13 and bottom layer 11 and may be used to provide shape, support and cooling to source 10. The support structure 24 is also shown in FIG. 4b in a cross-sectional view of source 10 along the A–A' line depicted in FIG. 4a. The support structure 24 may have a groove 16 that permits turns, such as turns 14 and 15, to pass from top layer 13 to bottom layer 11. Source 10 can also be mechanically supported by a number of spacers 34 as depicted in FIG. 5a and shown in cross-sectional view of source 10 in FIG. 5b. The types of materials that can be used as a supporting structure 24 or support spacers 34 include dielectric or insulating materials that have good heat conductivity and are able to withstand the high temperature created by the plasma 70. In addition, structure 24 can be used as a housing for water lines to cool the source 10 and the dielectric window 80. The support structure 24 and support spacers 34 are not necessary if the source materials are strong enough to maintain their general structural integrity. Note that, in FIGS. 4 and 5 the spacings h, as well as the spacings d, for top layer 13 and bottom layer 11, are depicted as constant but may be varied as described above. Also, both top layer 13 and bottom layer 11 are depicted having planar profiles but may have non-planar profiles as described above.

Figure 6A:
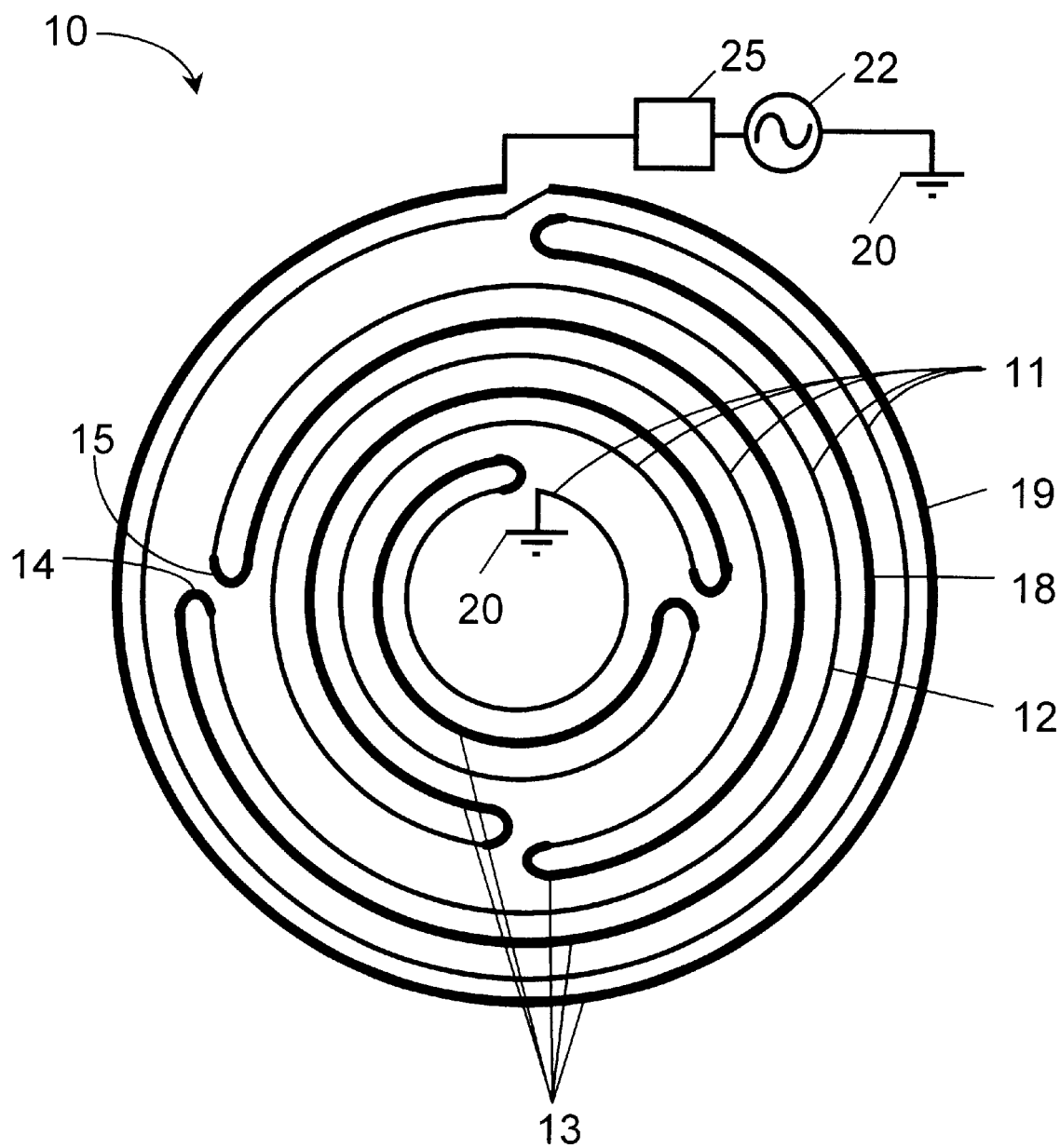
FIG. 6a is a top view of an alternative embodiment of a plasma source of the present invention.
Figure 6B:
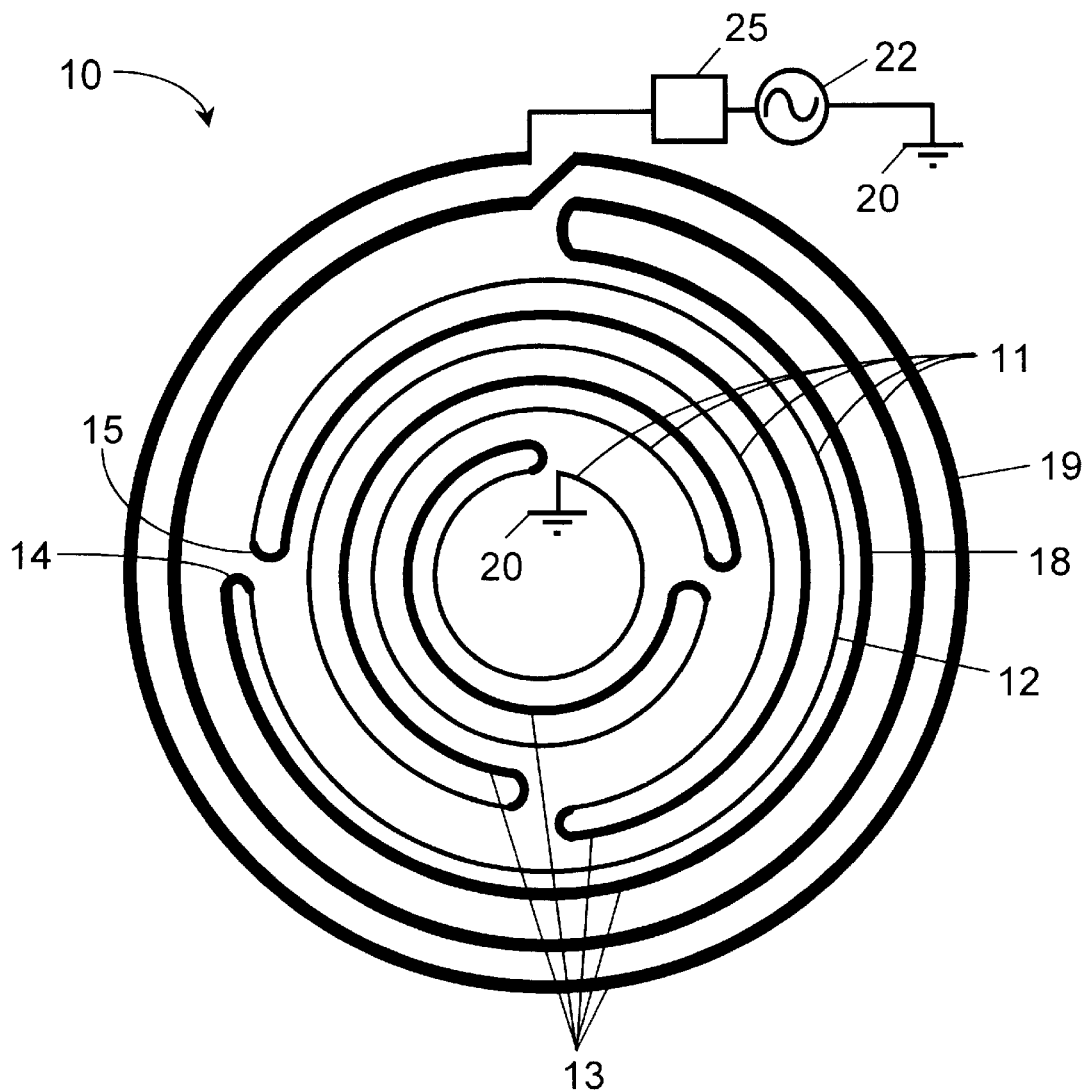
FIG. 6b is a top view of an alternative embodiment of ia plasma source of the present invention.

FIGS. 6a and 6b depict an alternate embodiment of a source 10 having a top layer 13 and a bottom layer 11. The loops of top layer 13 travel ¾ of the way, or 270 degrees, around the circumference of source 10 before entering a turn, such as turn 14. In these embodiments, the loops of bottom layer 11 travel circumferentially 360 degrees around source 10 in the opposite direction to that of the loops of top layer 13. A support structure (not pictured) may be disposed between top layer 13 and bottom layer 11, having four grooves such as those depicted in FIG. 2, perpendicularly oriented to each other, to provide shape and mechanical support for source 10. Specifically referring to FIG. 6b, the cross-sectional area of the loop of bottom layer 11 and top layer 13 are greater toward the outer circumference at source 10. Alternatively, it should be noted that the cross-section area of the loops may be varied throughout either bottom layer 11, top layer 13 or both to further control the uniformity of the plasma.

Turns, such as turn 14, connect the loops of bottom layer 11 with the loops of top layer 13. All loops, such as loop 12 of bottom layer 11, travel 360 degrees around the circumference of the source 10. On the other hand, the loops of top layer 13, such as loop 18 of top layer 13, travel 270 degrees before traversing the plane separating top layer 13 and bottom layer 11. Loop 19 of top layer 13 travels 360 degrees around the circumference of source 10 in the same direction as that of bottom layer loops 11, such that the magnetic field generated by loop 19 increases the total magnetic field at the edge of source 10, thus adjusting the plasma uniformity. Loop 19 of top layer 13, may travel in a direction opposite to that of the loops of bottom layer 11 and may travel 360 degrees around the circumference of source 10. Loop 19 terminates at rf power source 22.

While ¾ loops having a 270 degree circumference are used for the loops of top layer 13 in source 10, depicted in FIGS. 6a and 6b, those of skill in the art will recognize that alternative circumferential arcs may be used, for top layer 13 or bottom layer 11, to produce source 10 of the present invention. For example, loops of a source 10 with ⅛, ⅐, ⅙, ⅕, ¼, ⅓, or ½ circumferential arcs may be used, (i.e. 45, 51, 60, 72, 90, 120 or 180 degrees, respectively).

Figure 7:
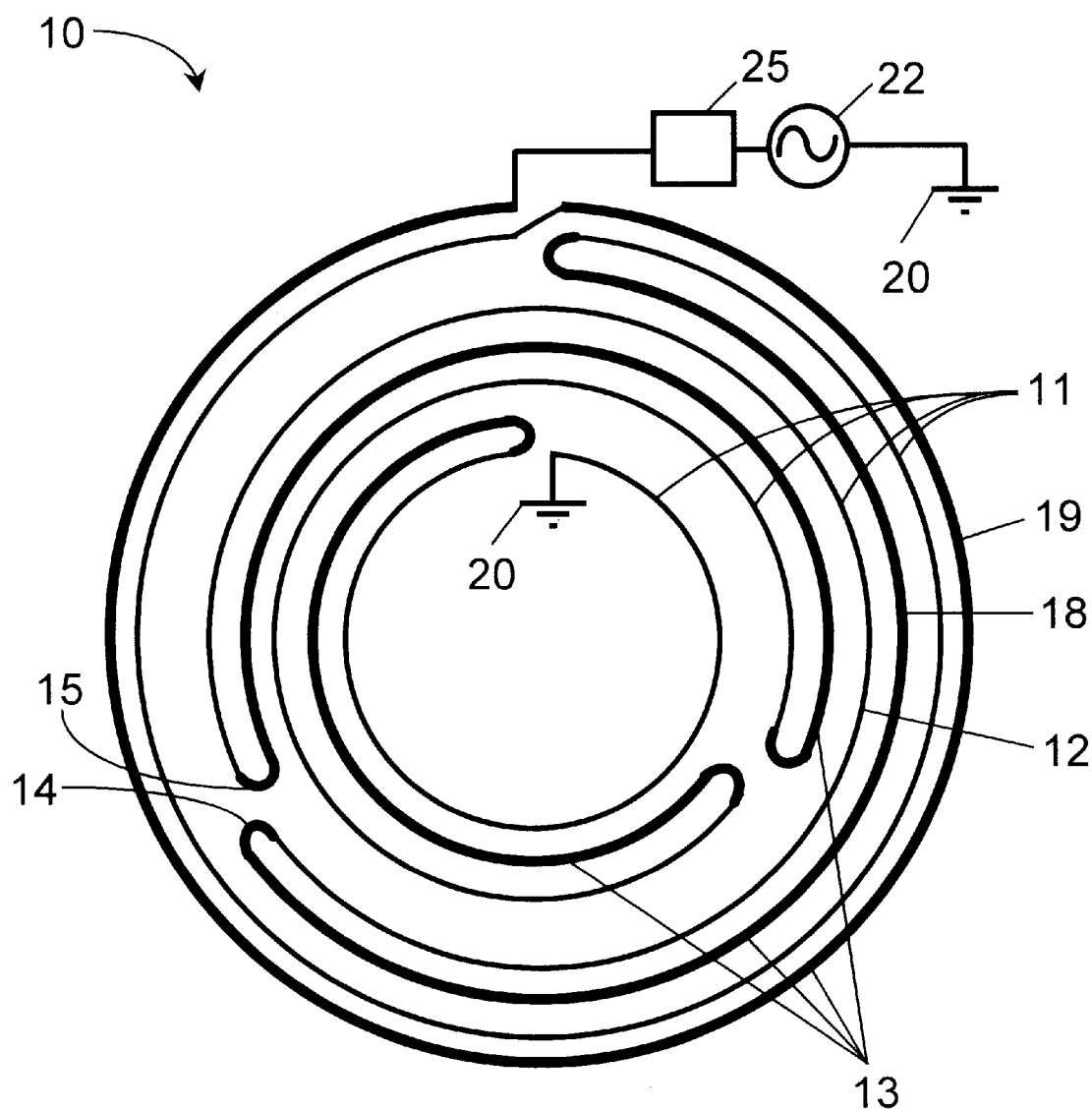
FIG. 7 is a top view of an alternative embodiment of a in plasma source of the present invention.
Figure 8:
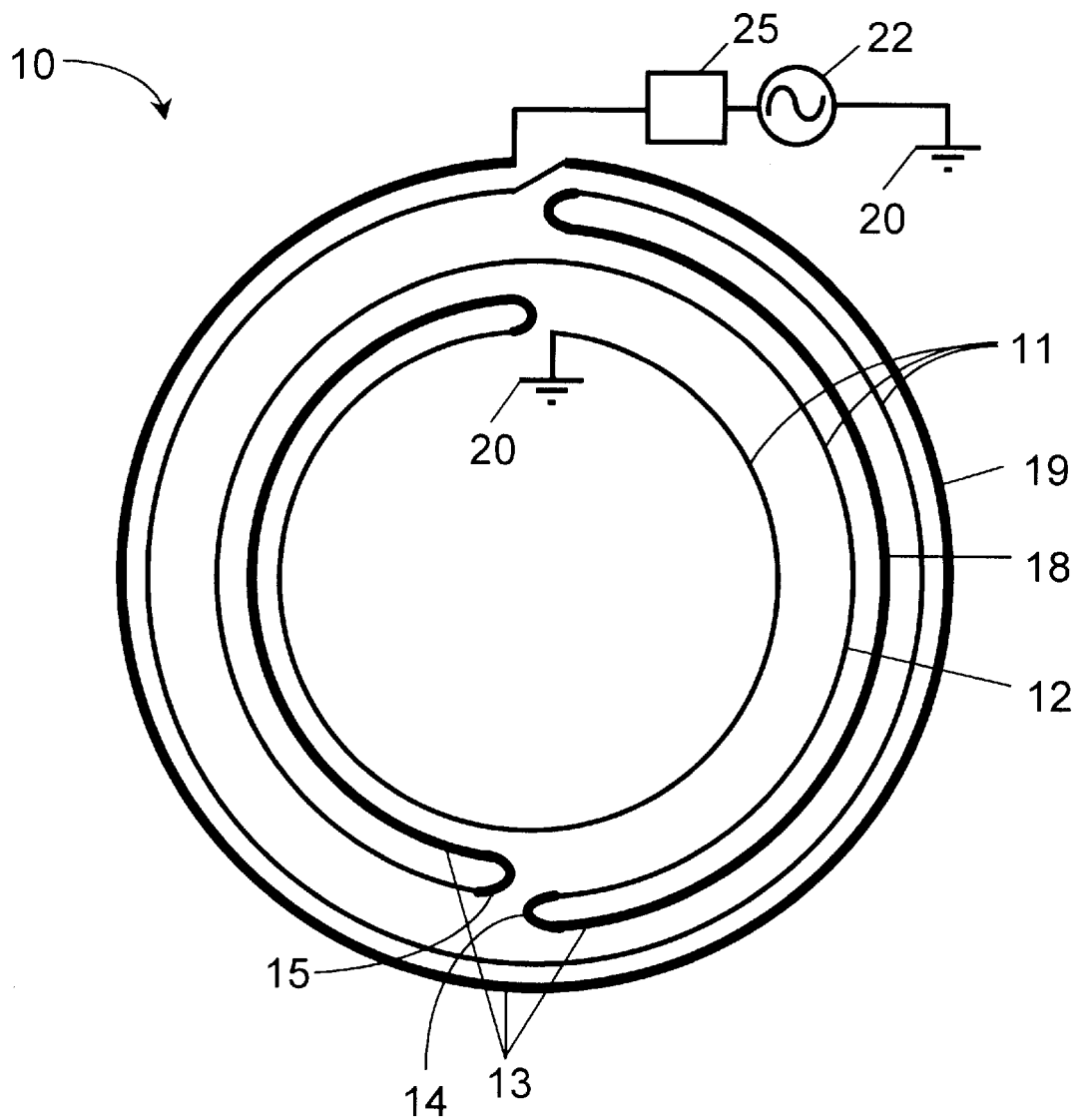
FIG. 8 is a top view of an alternative embodiment of a plasma source of the present invention.

Alternatively, loops having greater than ½ or 180 degrees circumferential arcs may be used, such as ⅔, ¾, ⅘, ⅚, 6/7 or ⅞ circumferential arcs (i.e. 240, 270, 288, 300, 309 or 315 degrees, respectively). In addition, loops of any intermediate fractions to the fractions listed above may be used in top layer 13 and bottom layer 11 to produce source 10. For example, alternative embodiments of the source 10, with ⅔ circumferential arcs or 240 degrees of top layer 13 is depicted in FIG. 7, and with ½ circumferential arcs or 180 degrees is depicted in FIG. 8. All the loops having the various circumferential arcs described above may be repeated an arbitrary number of times at arbitrary radii and in any order to produce source 10.

Figure 9:
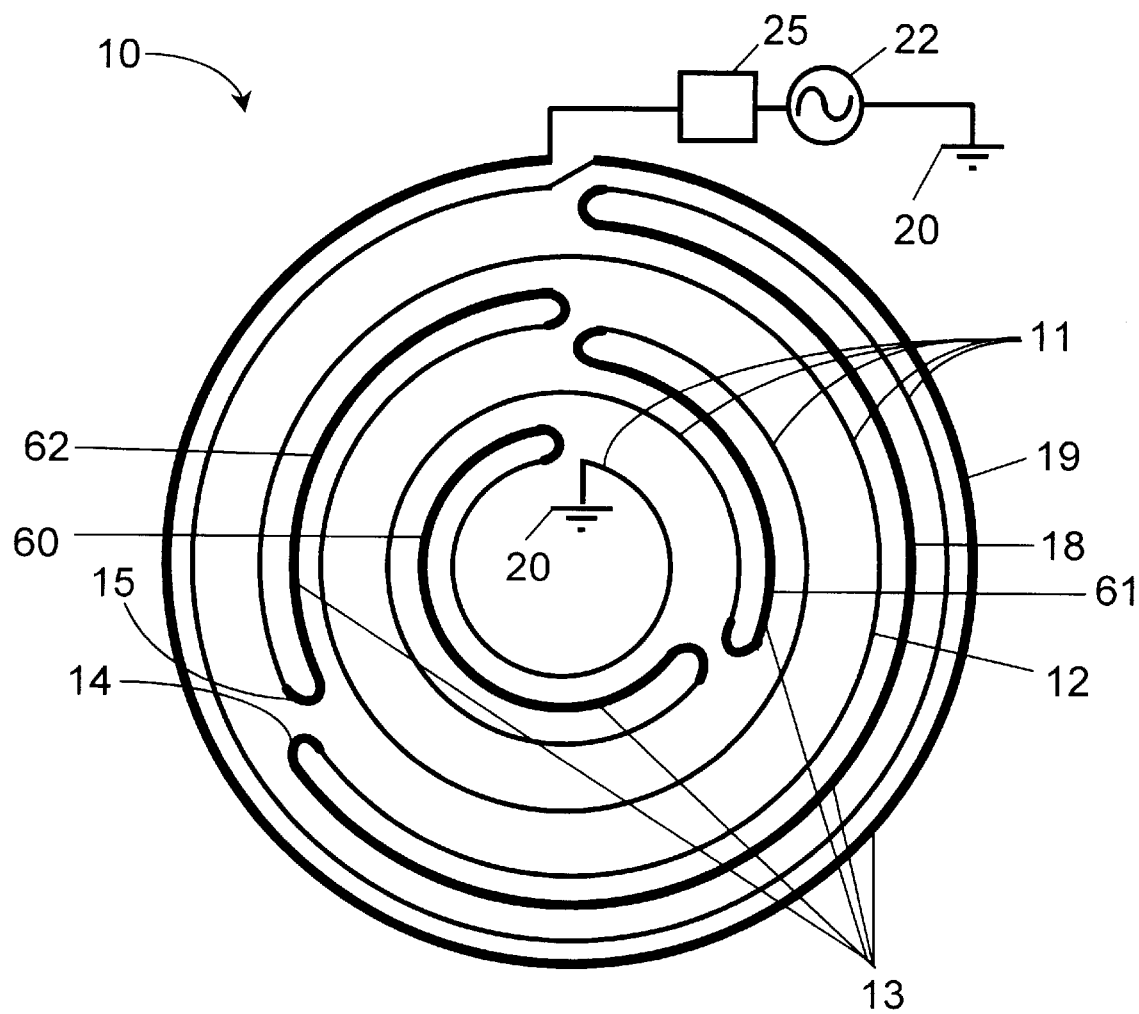
FIG. 9 is a top view of an alternative embodiment of a plasma source of the present invention.

Source 10 may also be produced by using arbitrary number of mixed circumferential arcs or styles for top layer 13 or bottom layer 11. For example, an alternative embodiment of source 10 is depicted in FIG. 9, where the loops of top layer 13 have mixed circumferential arcs. In top layer 13, loop 60 has a ⅔ circumferential arc or 240 degrees, while loops 61 and 62 have ⅓ circumferential arcs or 120 degrees, then loop 18 has a ⅔ circumferential arc or 240 degrees, and finally loop 19 travels 360 degrees in the same direction as the loops of bottom layer 11. Any number of different circumferential arcs may be used in any order to produce the structure of source 10, in a manner to adjust the azimuthal and radial symmetries of the magnetic fields generated by source 10, hence generating high density plasma of high uniformity over a large processing area.

Figure 10:
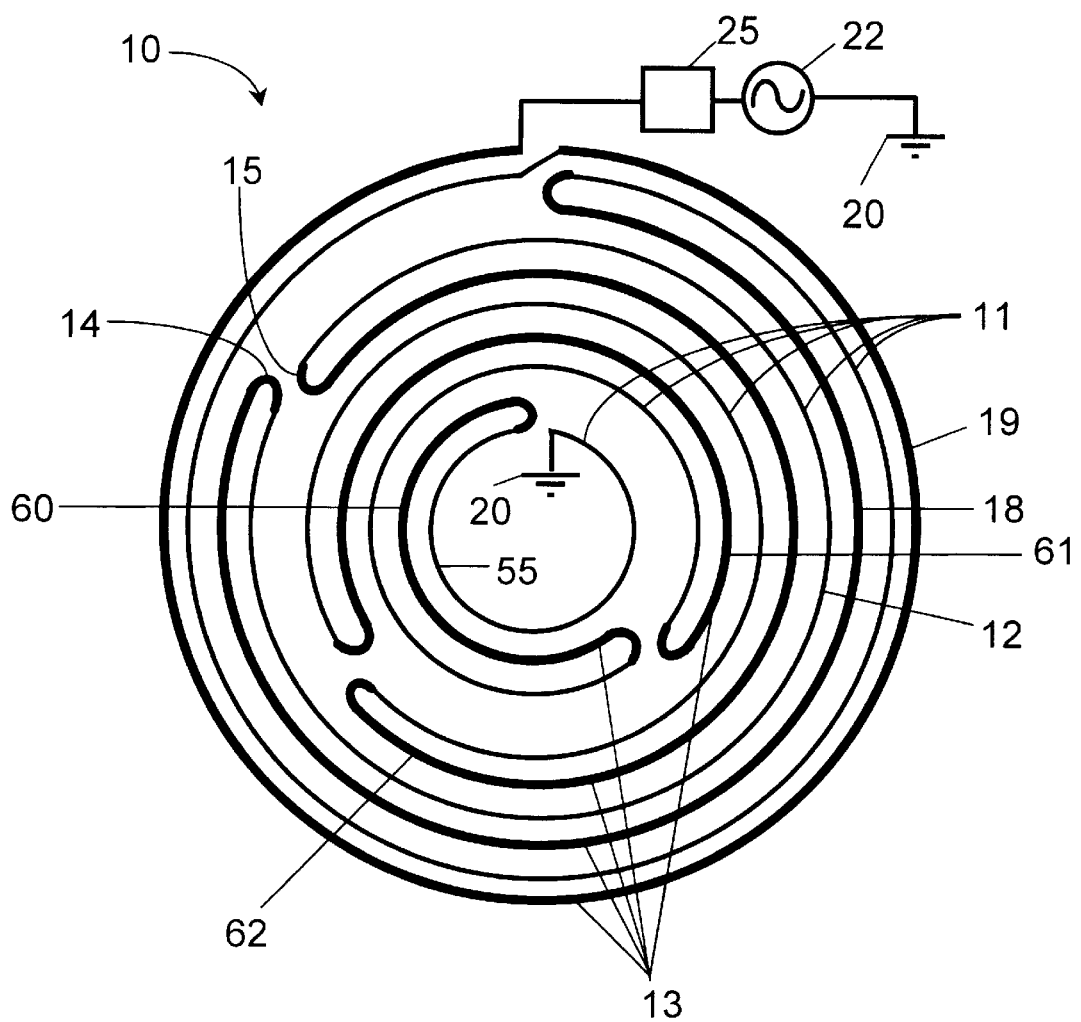
FIG. 10 is a top view of an alternative embodiment of a plasma source of the present invention.

Another method of mixing circumferential arcs in producing source 10 is that, each individual loop of top layer 13 may have different circumferential arcs, such that the circumferential gaps between the ends of each of the loops of top layer 13 have the same length. For example, in source 10 depicted in FIG. 10, the radius of loop 55 may be r=5 cm, and the radial spacing between the loops may be d=0.64 cm. For these dimensions of source 10, the circumferential gaps between the ends of each loop of top layer 13, except loop 19, is approximately 11.7 cm. This requires the circumferential arcs of the loops of top layer 13 to be 243 degrees for loop 60, 264 degrees for loop 61, 279 degrees for loop 62 and 290 degrees for loop 18. In FIG. 10, loop 19 travels about 360 degrees around the circumference of source 10 in the same direction as the loops of bottom layer 11. The specific dimensions for source 10 given here are only an example. It should be noted that the circumferential gaps between the ends of the loops of top layer 13 will vary for different values of r and d. Also, it will be apparent to those skilled in the art that the circumferential gaps between the ends of loops need not be the same length. In fact, the circumferential loops may alternatively have the same arc lengths or may have different lengths.

Figure 11:
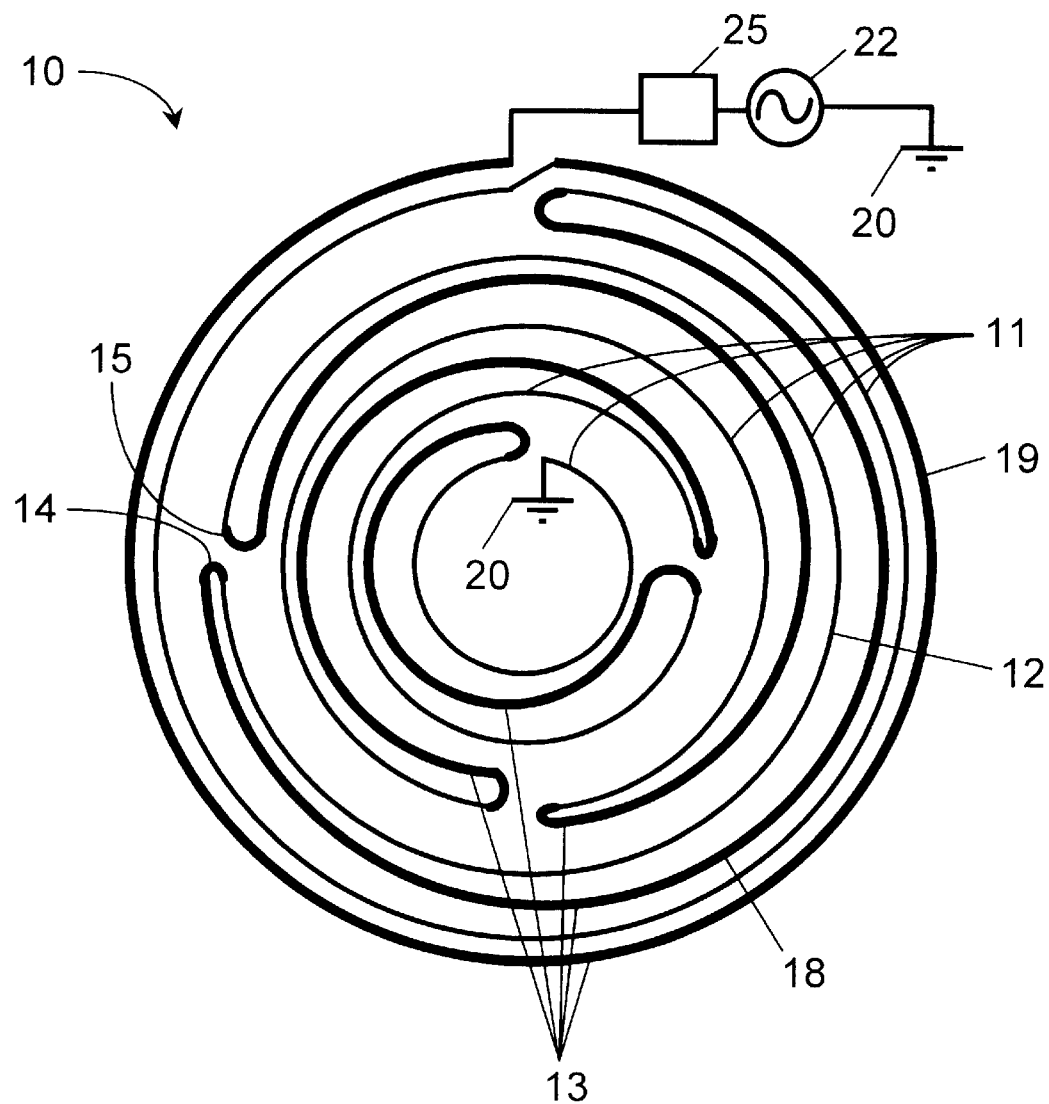
FIG. 11 is a top view of an alternative embodiment of a plasma source of the present invention.

In another embodiment of source 10, depicted in FIG. 11, the loops of top layer 13 have different centers of rotation from that of bottom layer 11. In this embodiment of source 10, the individual loops of top layer 13 and/or bottom layer 11 may have arbitrary centers of rotation. The arbitrary positioning of the individual loops can be used to improve the symmetry of the electromagnetic fields generated by source 10, hence the plasma uniformity. This design parameter of source 10, among others described in this disclosure, allows the scaleability of source 10 to produce high density plasmas of high uniformity over a large processing area.

Figure 12:
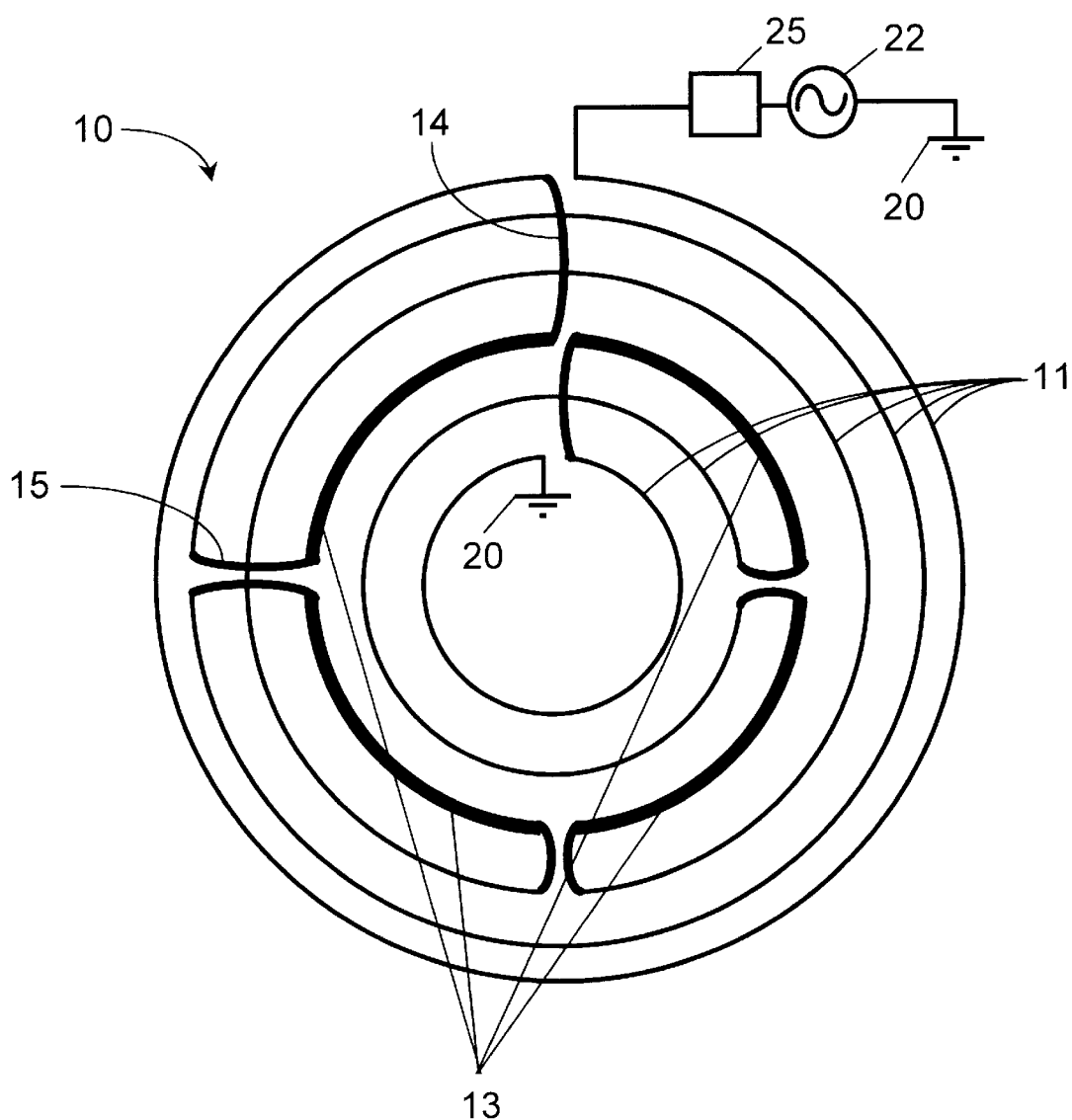
FIG. 12 is a top view of an alternative embodiment of a plasma source of the present invention.

The loops of top layer 13 may have arbitrary radii and circumferential arcs to produce source 10. These parameters, along with the three dimensional structure, of source 10 may be used to produce source 10 with high geometrical symmetry around it axis. This is illustrated in the alternative embodiment of source 10 depicted in FIG. 12. In this figure, source 10 has the form of concentric rings, such that the electromagnetic fields generated by source 10 have high azimuthal and radial symmetries around its axis. The loops of bottom layer 11 travel 360 degrees around the circumference of source 10. On the other hand, the loops of top layer 13 travel ¼ of the way or 90 degrees around the circumference of source 10 in a direction opposite to that of the loops of bottom layer 11. The loops of top layer 13 are spaced the same distance h above the dielectric window 80, and have the same radius around the same center of rotation. The three dimensional structure of source 10 allows the loops of top layer 13 to have the same radius and the same spacing h above the dielectric window 80, where the turns connecting top layer 13 to bottom layer 11, such as turns 14 and 15, are elevated in space from bottom layer 11. The loops of top layer 13 can have any circumferential arc of the same or different fractions in order to produce source 10 as depicted in FIG. 12.

Figure 13A:
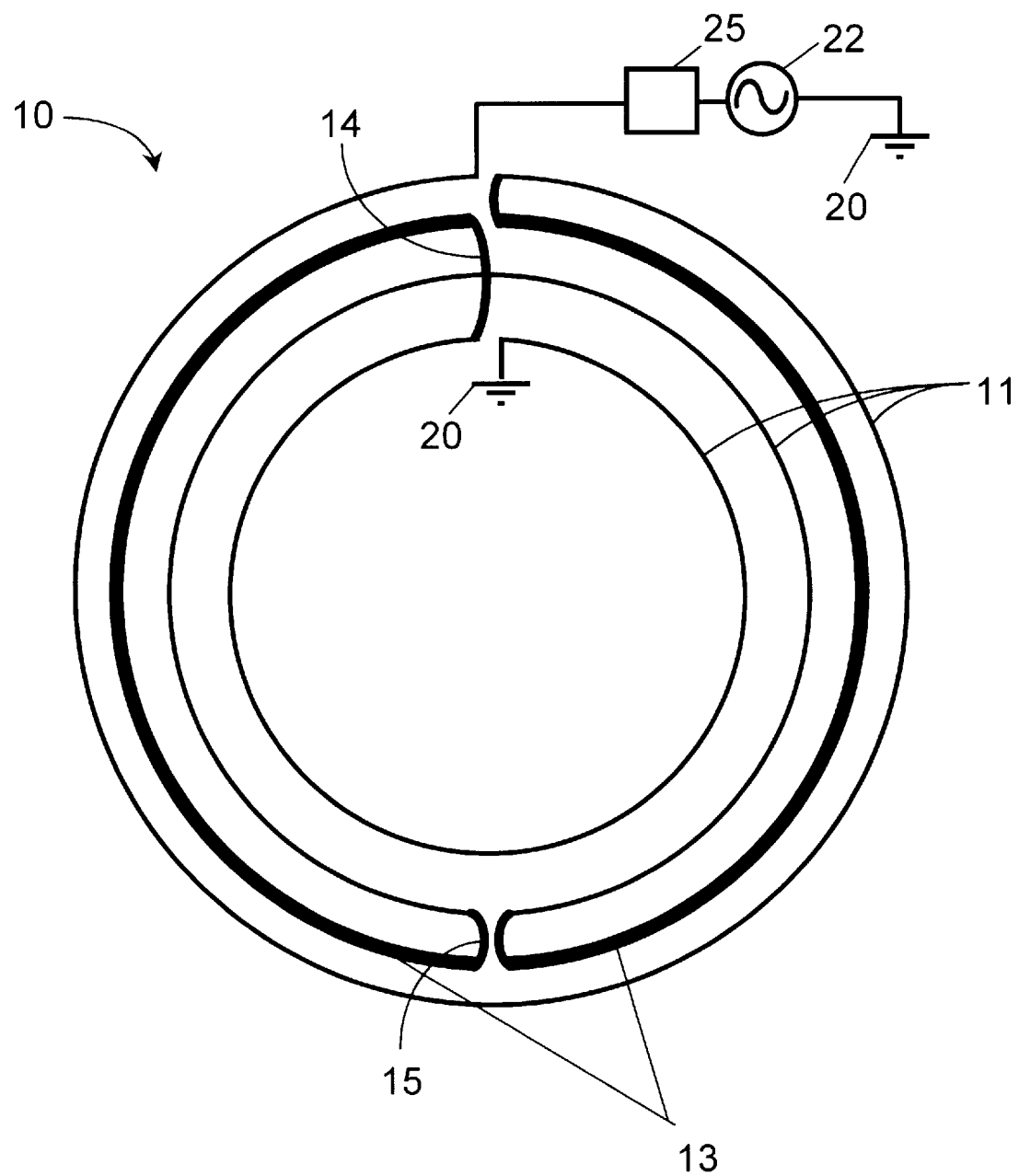
FIG. 13a is a top view of an alternative embodiment of a plasma source of the present invention.

FIG. 13a is another embodiment of source 10 of the present invention. The loops of bottom layer 11 travel 360 degrees around the circumference of source 10, while the loops of top layer 13 travel ½ the way or 180 degrees. The two 180 degree loops of the top layer 13 have the same radius, thus forming a 360 degree circle that is concentric with the loops of bottom layer 11. Thus, the electromagnetic fields generated by source 10 are very symmetric around its axis. Source 10 generates rf magnetic fields that induce an azimuthal electric field, $E_\theta$, which has a maximum magnitude closer to the center of source 10 shown in FIG. 13a. This is due to the fact that, the rf current flows in top layer 13 in a direction opposite to that in the bottom layer 11, and that top layer 13 have a radius closer to the outer edge of source 10, thus reducing the magnetic field and the induced electric field near the outer edge.

Figure 13B:
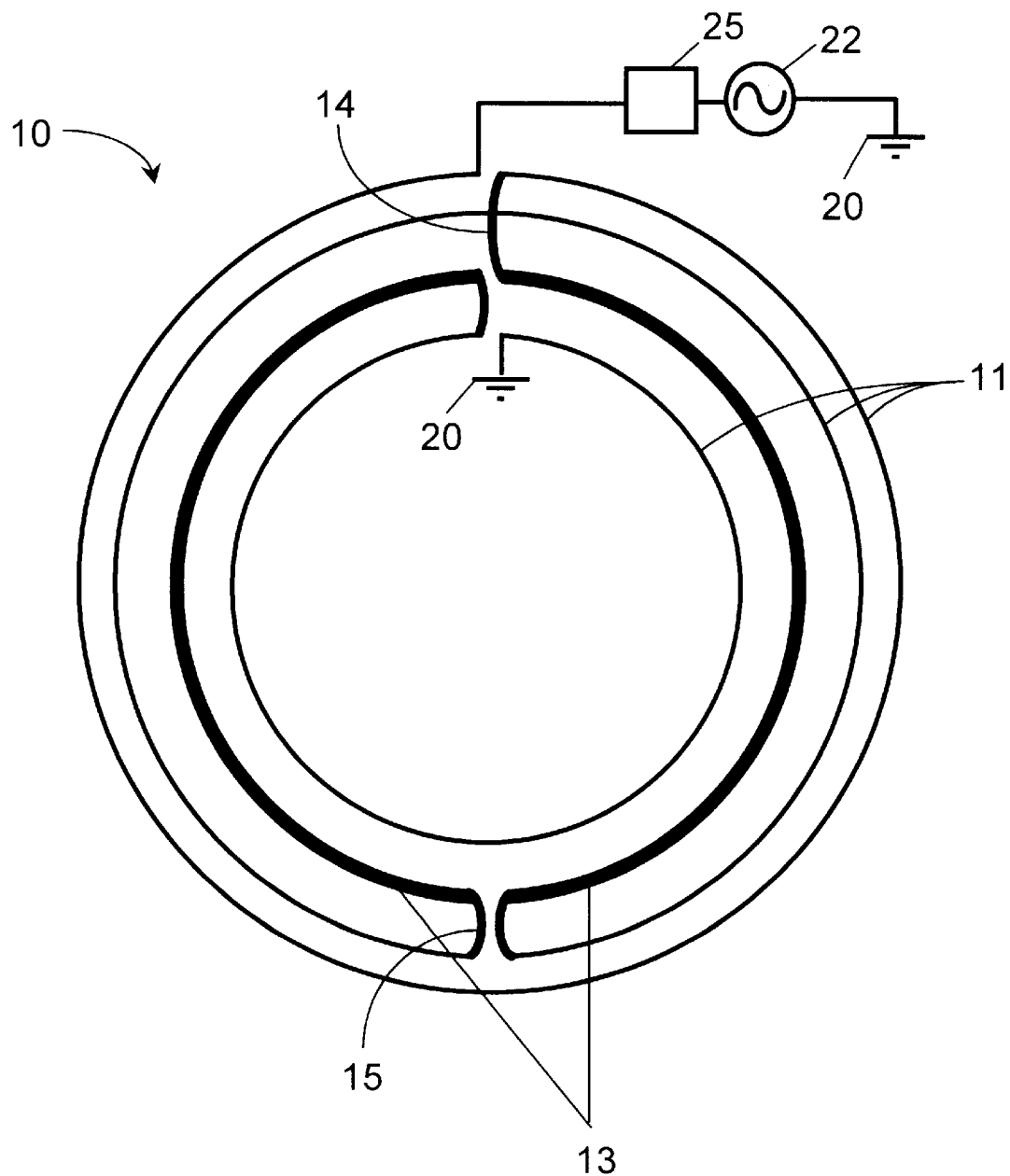
FIG. 13b is a top view of an alternative embodiment of a plasma source of the present invention.

Alternatively, due to the three dimensional structure of source 10, the top layer 13 can be made to have a smaller radius (i.e. closer to the center of source 10) as shown in FIG. 13b. As a result, the magnetic fields are reduced near the center of source 10, causing the electric field to have a maximum magnitude closer to the outer edge of source 10 and around its circumference. This produces a high density plasma that is uniform over a larger area due to an increase in the radius of the maximum power deposition region. As a result, these embodiments of source 10 may be used to flatten the plasma density profile across the wafer surface. A similar effect can be achieved in all embodiments of source 10 by making the radii of the loops of top layer 13 and/or the loops of bottom layer 11 much larger than the spacing d between the loops, i.e. r+s>>s. This leaves the central area of source 10 open without any loops from either top layer 13 or bottom layer 11, where the induced electric field is greatly reduced there, while significantly increased around the outer edge of source 10. Such parameters, along with other parameters described herein, demonstrate the flexibility of the plasma source 10 design in optimizing the electromagnetic field profiles and the resulting plasma density profile for uniform processing of large substrates.

Figure 14:
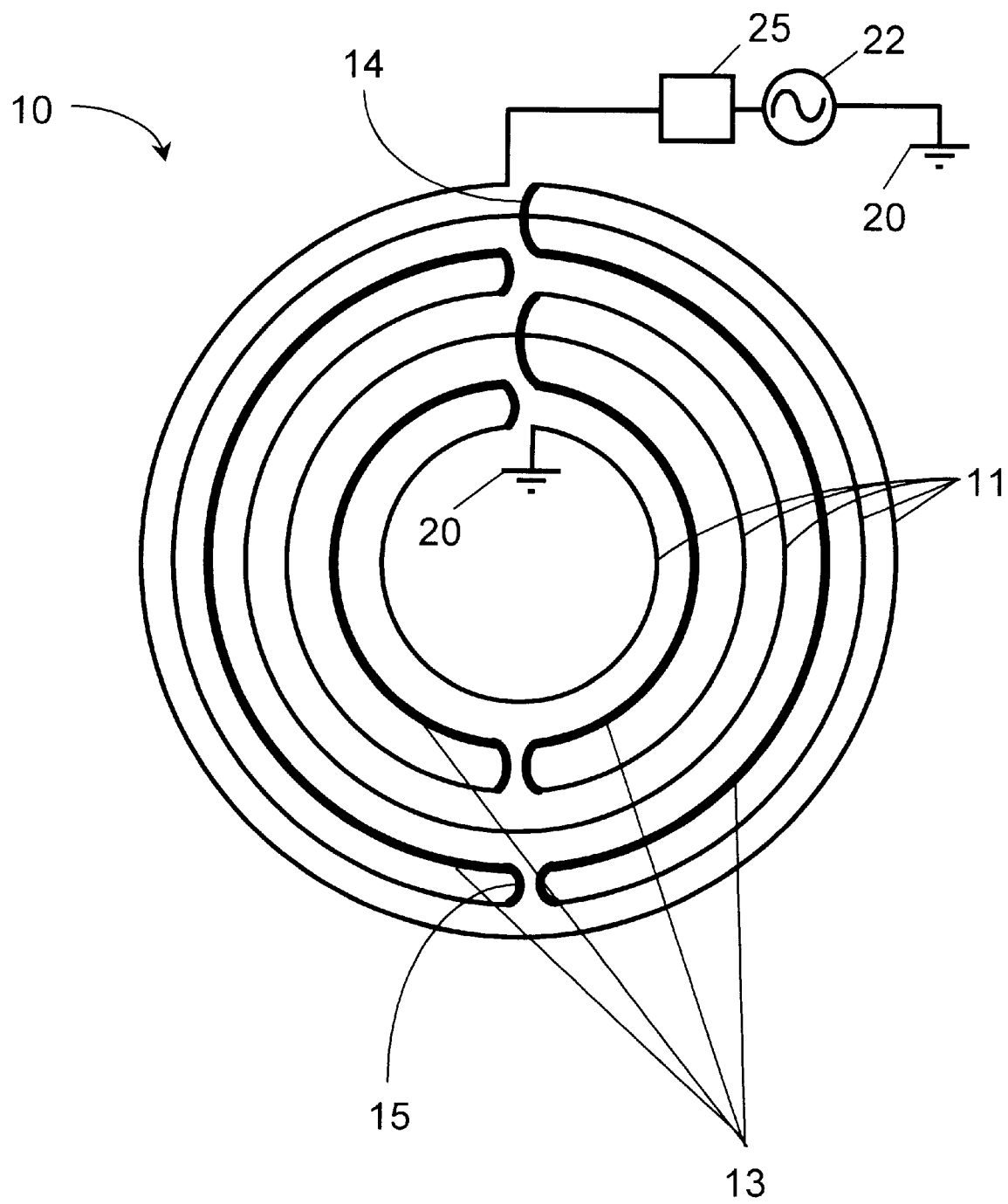
FIG. 14 is a top view of an alternative embodiment of a plasma source of the present invention.

FIG. 14 depicts a source 10 which combines the features of the sources 10 described with reference to FIGS. 13a and 13b. The loops of bottom layer 11 travel 360 degrees around the circumference of source 10 while the loops of top layer 13 travel 180 degrees around the circumference of source 10. Two of the 180 degrees loops of top layer 13 have the same radius which forms a 360 degrees circle that is concentric to the loops of bottom layer 11 and is oriented near the outer circumference of source 10. The other two 180 degrees loops of top layer 13 share a smaller radius also forming a 360 degrees circle that is concentric to the loops of bottom layer 11 and are disposed near the center of source 10.

Figure 15:
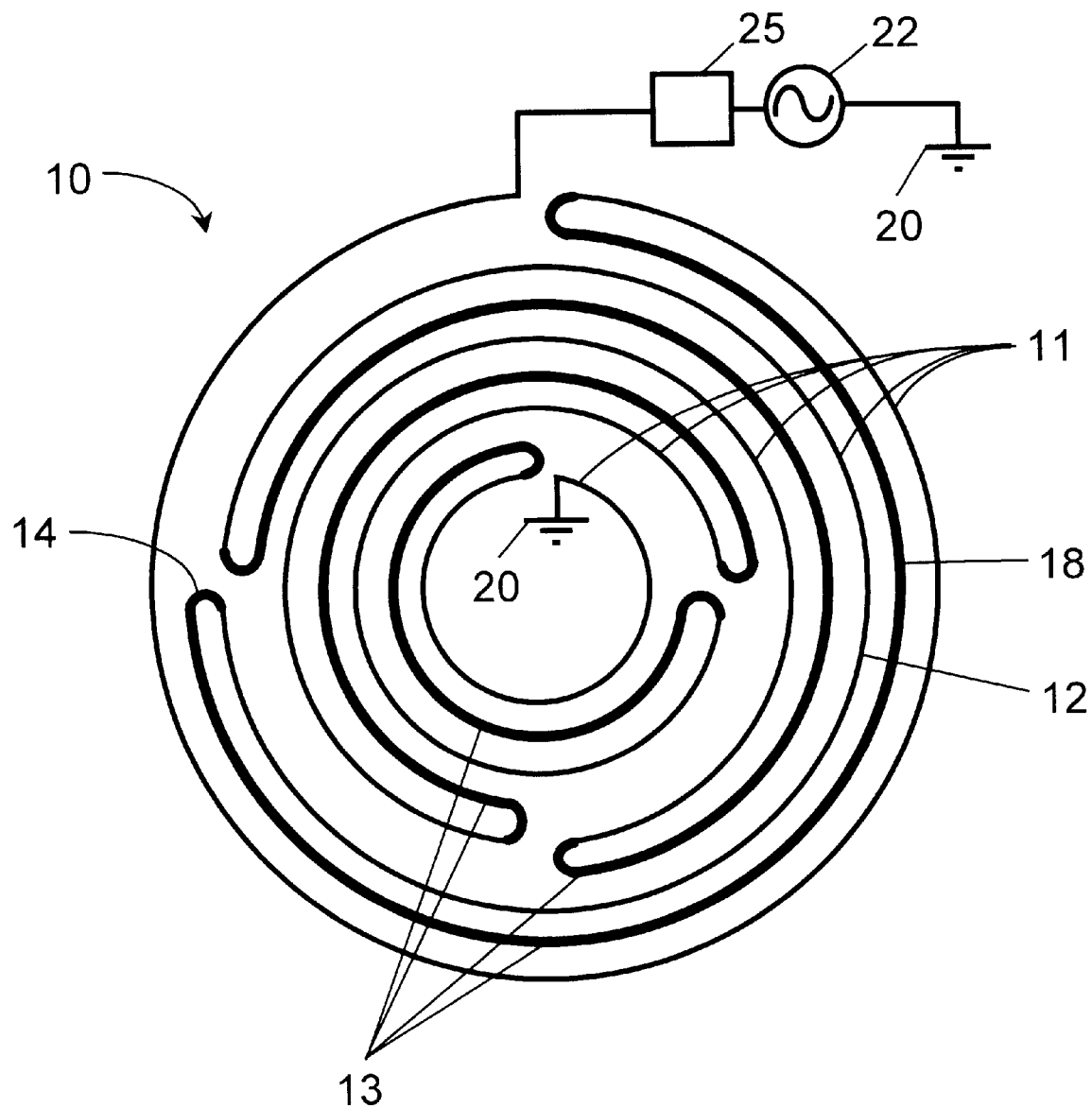
FIG. 15 is a top view of an alternative embodiment of a plasma source of the present invention.

The alternative embodiment of source 10, shown in FIG. 15, was used experimentally, as an example, to produce high density plasmas in argon and $SF_6$ at low pressures. Note that, source 10 in FIG. 15 is similar to that depicted in FIG. 6 and has ¾ circumferential arcs on top layer 13, with the exception of loop 19. The ion density and ion saturation current were measured by a Langmuir probe in argon and $SF_6$ at pressures between 5 and 20 mTorr at 25 sccm gas flow rate (see FIG. 16). The Langmuir probe measurements were taken at the discharge center about 1 cm above the wafer surface 152, and about 11.5 cm below the dielectric (quartz) window 80 for source 10 input powers between 500 to 1000 Watts at 13.56 MHz rf frequency.

Source 10 produced high plasma densities ($10^{11}$–$10^{12}$ $cm^{-3}$) at low pressures as can be seen from FIG. 16. Both the ion density and ion saturation current increased linearly with source 10 input power for argon discharges. FIGS. 16c and 16d show that the ion density and ion saturation current also increased in $SF_6$ discharges as the source 10 input power was increased. Source 10 can also be used at higher gas flow rates to produce plasma 70 of higher densities at the same pressure and source 10 input power.

Source 10 of the present invention couples the rf power inductively to plasma 70 through the dielectric window 80. The rf magnetic fields generated by source 10 induce an azimuthal rf electric field $E_\theta$ inside the chamber 50. When a gas is introduced into the chamber 50, the electric field initiates and sustains a plasma 70. The electric field has a spatial profile that peaks around mid-space between the center of source 10 and its edge. $E_\theta$ accelerates the plasma free electrons, in a direction parallel to the wafer surface 152, in an oscillatory motion as they move radially towards the plasma center and its boundaries, thus, absorbing rf power and gaining time-average energy, even in the absence of collisions with other plasma species. Since the spatial profile of the power deposition region, from source 10 to plasma 70, is proportional to the spatial profile of induced $E_\theta$, then the profiles of the magnetic fields generated by source 10 have a large impact on the power deposition into plasma 70, thus its characteristics including uniformity.

Due to the three dimensional structure of source 10, along with the other parameters discussed herein, source 10 can be made to have a very high symmetry. The loops of top layer 13 are elevated in space above the loops of bottom layer 11, such that, source 10 can be made in the form of concentric loops of high radial and azimuthal symmetries. As a result, source 10 generates magnetic fields that have improved azimuthal and radial symmetries compared to fields generated by, for example, conventional spiral coils.

A magnetic field (B-Dot) probe was used to measure the magnitudes of the magnetic fields generated by source 10, depicted in FIGS. 15 and 17a, and a spiral coil having five loops, depicted in FIG. 18a, at 13.56 MHz in free space. The magnetic probe was calibrated against a solenoid of known magnetic field magnitude at 13.56 MHz. The five loops of the spiral coil have similar diameters and horizontal spacings as those of the bottom layer 11 of source 10 depicted in FIG. 17a. The probe was scanned radially about 3 cm below both source 10 and the spiral coil and across their diameter. The spatial profile of the magnetic fields were obtained at the different azimuthal positions as indicted in FIGS. 17a and 18a.

The radial and axial magnetic fields, $B_r$ and $B_z$ respectively, spatial profiles for source 10, depicted in FIG. 17a, are plotted in FIGS. 17b and 17c, respectively. Similarly, the spatial profiles of $B_r$ and $B_z$ for the spiral coil, depicted in FIG. 18a, are plotted in FIGS. 18b and 18c, respectively.

Comparing FIGS. 17b to 18b and FIGS. 17c to 18c, it can be seen that source 10 of the present invention generates magnetic fields that have spatial profiles of high azimuthal and radial symmetries compared to the fields generated by the spiral coil. Simulation results from an electromagnetic code, that calculates the magnetic fields of both source 10 and the spiral coil in three dimensions, also showed that source 10 of the present invention generates magnetic field profiles of high azimuthal and radial symmetries, when compared to the spiral coil.

FIGS. 17 and 18 also show that, the plasma source 10 of the present invention, depicted in FIG. 17a, is more efficient in generating magnetic fields at the same current compared to the spiral coil, depicted here in FIG. 18a. In other words, source 10 has larger values of $|B_r|/I$ and $|B_z|/I$ (in Gauss/Amp). The magnetic field spatial profiles symmetry, generated by sources 10, can be modified by adjusting the design of source 10 according to the different design parameters discussed herein. As a consequence, sources 10 of the present invention produce a more uniform plasma 70 than spiral coils by using a multi-layer configuration in which two (or more) separate layers of loops, and the current flow direction in each loop, are used to improve and control the magnetic field spatial profiles generated by source 10.

Figure 19:
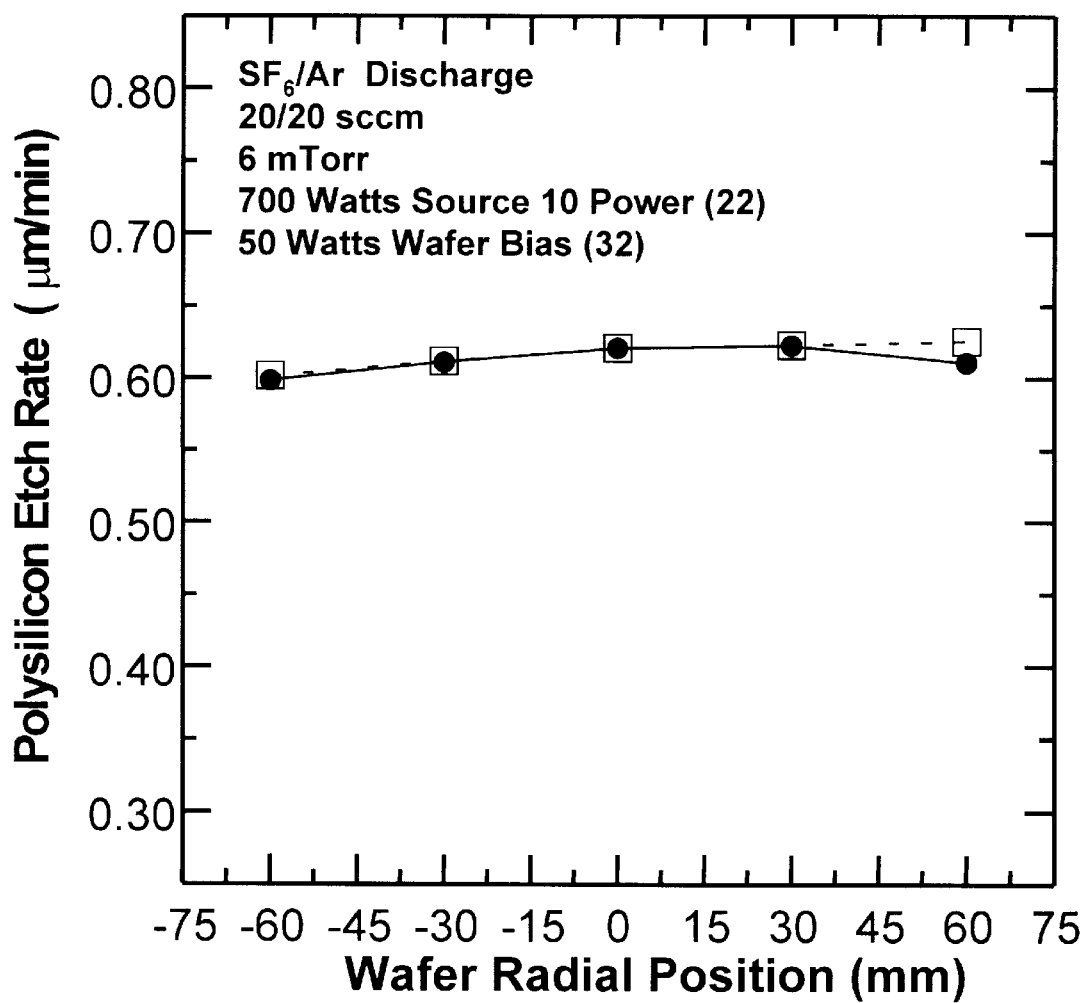
FIG. 19 is a plot of polysilicon etch rate profiles across the wafer surface in perpendicular directions using the plasma source of the present invention.

Source 10 of the present invention may be used in numerous applications such as, but not limited to, plasma etching, thin film deposition (e.g. PECVD), ion immersion implantation (PIII), and ion milling. Here, the performance of source 10 is demonstrated for 150 mm polysilicon on oxide wafer etching, as an example. FIG. 19 shows the polysilicon etch rate spatial profiles across the wafer surface 152, in two directions perpendicular to each other, achieved using source 10 of the present invention. More particularly, it demonstrates the plasma etch rate profile obtained with source 10 depicted in FIG. 15. The etch was performed in $SF_6$/Ar discharge at 6 mTorr pressure, 40 sccm gas flow rate, 700 Watt source input power 22 and 50 Watt bias power 32, both operating at 13.56 MHz rf frequency. As can be seen from FIG. 19, the etch rates are very high (despite the low gas flow rate) and very uniform across the wafer surface 152 along both directions. The etch rate variations, i.e. non-uniformity, along either direction are less than 2%.

More particularly, the plasma 70 generated by sources 10 is most uniform in the area over which it is needed, specifically, a silicon wafer 150 that is being processed. By providing a multi-layer source 10 having a top layer 11 and a bottom layer 13, both of which may be varied in the radial, azimuthal and axial directions, the electromagnetic field spatial profiles generated by source 10 can be adjusted to produce a plasma of high etch uniformity over a large processing area. Not only does this configuration provide a more uniform plasma 70 within the plasma chamber 50, but it also produces a more uniform plasma 70 over the entire surface 152 of the silicon wafer 150 that is being processed.

To further improve the performance of source 10 of the present invention, dipole magnets may be arranged in an array around the discharge region in chamber 50. The magnetic field cusps produced by the dipole magnets arrangement around the plasma 70 region, generated by source 10, enhance the plasma confinement around its boundaries, hence enhancing the plasma uniformity and increasing its density.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A plasma source comprising:
    a first loop forming a first layer; and
    a second loop forming a second layer electrically connected to and spaced apart from said first loop, wherein subsequent conducting loops are electrically connected to loops in layers other than their own.

2. The source as recited in claim 1 wherein said first and second layers further comprise a plurality of loops.

3. The source as recited in claim 2 wherein said plurality of loops of said first layer and said second layer are generally concentric.

4. The source as recited in claim 2 wherein said plurality of loops of said first layer have a plurality of centers of rotation.

5. The source as recited in claim 2 wherein said loops of said first layer further comprise circumferential arcs between about 20 degrees and 360 degrees.

6. The source as recited in claim 5 wherein said loops of said first layer further comprise circumferential arcs between about 90 degrees and 270 degrees.

7. The source as recited in claim 2 wherein the ends of each of said loops of said first layer define a circumferential gap therebetween.

8. The source as recited in claim 7 wherein each of said circumferential gap has the same length.

9. The source as recited in claim 7 wherein each of said circumferential gap has the same arc length.

10. The source as recited in claim 2 wherein said loops of said first layer further comprise circumferential arcs between about 20 degrees and 360 degrees and said loops of said second layer further comprise circumferential arcs between about 20 degrees and 360 degrees.

11. The source as recited in claim 10 wherein said loops of said first layer further comprise circumferential arcs between about 90 degrees and 270 degrees.

12. The source as recited in claim 2 wherein adjacent loops of said second layer define radial gaps therebetween and wherein at least one of said loops of said first layer is disposed radially between at least one of said radial gaps.

13. The source as recited in claim 2 wherein at least one of said loops of said second layer has the same radius as at least one of said loops of said first layer.

14. The source as recited in claim 2 wherein the cross-sectional area of at least one of said loops of said first layer is greater than the cross-sectional area of at least one of the other of said loops of said first layer.

15. The source as recited in claim 2 wherein the cross-sectional area of at least one of said loops of said first layer varies along the length of said at least one of loops of said first layer.

16. The source as recited in claim 2 wherein a current flows in a first direction in at least one of said loops of said first layer and in a second direction in at least one of said loops of said second layer.

17. The source as recited in claim 2 wherein said loops of said first layer each have the same radius such that said loops of said first layer substantially form a circle.

18. The source as recited in claim 2 wherein half of said loops of said first layer have a first radius and the other half of said loops of said first layer have a second radius such that said loops of said first layer substantially form first and second circles.

19. The source as recited in claim 1 wherein said first layer has a substantially planar profile.

20. The source as recited in claim 1 wherein said first layer has a non-planar profile.

21. The source as recited in claim 1 further comprising a support structure disposed generally between said first and second layers.

22. The source as recited in claim 1 further comprising at least one spacer member disposed generally between said first and second layers.

23. An apparatus for generating a uniform plasma in a chamber by producing magnetic fields of high symmetry comprising:
   a first layer of loops; and
   a second layer of loops electrically connected to and spaced apart from said first layer of loops, wherein alternating loops are electrically connected to loops in layers other than their own.

24. The source as recited in claim 23 wherein said loops of said first layer further comprise circumferential arcs between about 20 degrees and 360 degrees.

25. The source as recited in claim 23 wherein the ends of each of said loops of said first layer define a circumferential gap therebetween.

26. The source as recited in claim 25 wherein each of said circumferential gap has the same length.

27. The source as recited in claim 25 wherein each of said circumferential gap has the same arc length.

28. The source as recited in claim 23 wherein said loops of said first layer further comprise circumferential arcs between about 20 degrees and 360 degrees and said loops of said second layer further comprise circumferential arcs between about 20 degrees and 360 degrees.

29. The source as recited in claim 23 wherein adjacent loops of said second layer define radial gaps therebetween and wherein at least one of said loops of said first layer is disposed radially between at least one of said radial gaps.

30. The source as recited in claim 23 wherein at least one of said loops of said second layer has the same radius as at least one of said loops of said first layer.

31. The source as recited in claim 23 wherein the cross-sectional area of at least one of said loops of said first layer near the perimeter of said source is greater than the cross-sectional area of at least one of said loops of said first layer near the center of said source.

32. The source as recited in claim 23 wherein the cross-sectional area of at least one of said loops of said first layer near the center of the source is greater than the cross-sectional area of at least one of said loops of said first layer near the perimeter of said source.

33. The source as recited in claim 23 wherein a current flows in a first direction in at least one of said loops of said first layer and in a second direction in at least one of said loops of said second layer.

34. The source as recited in claim 23 wherein said loops of said first layer each have the same radius such that said loops of said first layer substantially form a circle.

35. The source as recited in claim 23 wherein half of said loops of said first layer have a first radius and the other half of said loops of said first layer have a second radius such that said loops of said first layer substantially form first and second circles.

36. The source as recited in claim 23 wherein said first layer has a substantially planar profile.

37. The source as recited in claim 23 wherein said first layer has a non-planar profile.

38. The source as recited in claim 23 further comprising a support structure disposed generally between said first and second layers.

39. The source as recited in claim 23 further comprising at least one spacer member disposed generally between said first and second layers.

* * * * *